United States Patent
Kim et al.

(12)

(10) Patent No.: US 10,361,393 B2
(45) Date of Patent: Jul. 23, 2019

(54) DISPLAY APPARATUS INCLUDING A HIGH-DENSITY INORGANIC LAYER

(71) Applicant: Samsung Display Co., Ltd., Yongin-si, Gyeonggi-do (KR)

(72) Inventors: Changok Kim, Hwaseong-si (KR); Kiho Bang, Hwaseong-si (KR); Yeoungkeol Woo, Seoul (KR); Sangwook Lee, Yongin-si (KR); Hyeongi Cho, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 35 days.

(21) Appl. No.: 15/496,803

(22) Filed: Apr. 25, 2017

(65) Prior Publication Data

US 2017/0373270 A1    Dec. 28, 2017

(30) Foreign Application Priority Data

Jun. 28, 2016    (KR) .................. 10-2016-0081054

(51) Int. Cl.
    *H01L 27/32*    (2006.01)
    *H01L 51/00*    (2006.01)
    *H01L 51/52*    (2006.01)

(52) U.S. Cl.
    CPC ........ *H01L 51/5246* (2013.01); *H01L 27/323* (2013.01); *H01L 27/3262* (2013.01);
    (Continued)

(58) Field of Classification Search
    CPC ............. H01L 51/5246; H01L 51/5281; H01L 51/5253; H01L 27/323; H01L 51/0097; H01L 27/3262; H05B 33/04; G06F 3/044
    (Continued)

(56) References Cited

U.S. PATENT DOCUMENTS

| 9,367,162 B2 | 6/2016 | Lee |
| 2007/0164666 A1 | 7/2007 | Oosono et al. |

(Continued)

FOREIGN PATENT DOCUMENTS

| CN | 105511665 A | 4/2016 |
| JP | 2010-244696 | 10/2010 |

(Continued)

OTHER PUBLICATIONS

Plummer, et al., "Silicon VLSI Technology," Jan. 2008, Chapter 9, p. 15, XP-002775841.

(Continued)

*Primary Examiner* — Marcos D. Pizarro
*Assistant Examiner* — Nelson Garces
(74) *Attorney, Agent, or Firm* — Lewis Roca Rothgerber Christie LLP

(57) ABSTRACT

A display apparatus includes an organic light emitting display panel including a thin film encapsulation layer, a first conductive layer directly on the thin film encapsulation layer, at least one inorganic layer on the thin film encapsulation layer and having a density of about 2.05 $g/cm^3$ to about 2.4 $g/cm^3$, and a window on the at least one inorganic layer. In the display apparatus according to embodiments of the present disclosure, the generation of bubbles may be suppressed or reduced.

20 Claims, 25 Drawing Sheets

(52) U.S. Cl.
CPC ...... *H01L 51/0097* (2013.01); *H01L 51/5253* (2013.01); *H01L 51/5281* (2013.01)

(58) Field of Classification Search
USPC .......................................................... 257/40
See application file for complete search history.

(56) References Cited

U.S. PATENT DOCUMENTS

| | | | |
|---|---|---|---|
| 2014/0145979 A1* | 5/2014 | Lee | G06F 3/0412 345/173 |
| 2015/0153779 A1* | 6/2015 | Ko | G06F 1/1652 345/173 |
| 2015/0207102 A1* | 7/2015 | Jeong | H04M 1/0268 257/40 |
| 2016/0103549 A1* | 4/2016 | Lee | H01L 27/323 345/173 |
| 2017/0338288 A1 | 11/2017 | Lee et al. | |

FOREIGN PATENT DOCUMENTS

| | | |
|---|---|---|
| JP | 2013-232279 A | 11/2013 |
| JP | 2014-186850 | 10/2014 |
| KR | 10-2012-0106453 | 9/2012 |
| KR | 10-2014-0118955 | 10/2014 |
| KR | 10-2016-0043211 | 4/2016 |
| KR | 10-2016-0043227 | 4/2016 |
| KR | 10-2016-0059064 | 5/2016 |
| KR | 10-2017-0132397 | 12/2017 |

OTHER PUBLICATIONS

EPO Extended Search Report dated Dec. 6, 2017, for corresponding European Patent Application No. 17178427.5 (77pages).

* cited by examiner

DISPLAY APPARATUS INCLUDING A HIGH-DENSITY INORGANIC LAYER

CROSS-REFERENCE TO RELATED APPLICATION

This patent application claims priority to and the benefit of Korean Patent Application No. 10-2016-0081054, filed on Jun. 28, 2016, the entire content of which is hereby incorporated by reference.

BACKGROUND

One or more aspects of embodiments of the present disclosure herein relate to a display apparatus, and more particularly, to a display apparatus including a high-density inorganic layer.

Various display apparatuses that may be utilized in multimedia devices such as televisions, mobile phones, tablet computers, navigation devices, and game consoles are being developed. A display apparatus often includes a keyboard or a mouse as an input unit. Also, in recent years, a display apparatus may include a touch panel as an input unit.

Display apparatuses undergo reliability assessment under severe conditions before being released to the market. Only products that pass the reliability assessment are then sold to consumers.

SUMMARY

One or more aspects of embodiments of the present disclosure are directed toward a display apparatus that shows improved reliability when in severe conditions.

An embodiment of the inventive concept provides a display apparatus including an organic light emitting display panel, a window, a first conductive layer, a second conductive layer, at least one inorganic layer, and an organic layer. The organic light emitting display panel may include a base layer, a circuit layer on the base layer, a light emitting element layer on the circuit layer, and a thin film encapsulation layer on the light emitting element layer. The first conductive layer may be directly on the thin film encapsulation layer, the second conductive layer may be on the thin film encapsulation layer, where the second conductive layer may be on a layer other than the first conductive layer. At least one inorganic layer may be on the thin film encapsulation layer and may have a density of about 2.05 g/cm$^3$ to about 2.4 g/cm$^3$, and the organic layer may be on the at least one inorganic layer. The window may face the organic light emitting display panel with the first conductive layer, the at least one inorganic layer, and the organic layer between the window and the organic light emitting display panel.

In an embodiment, the at least one inorganic layer may include a silicon nitride layer having a density of about 2.05 g/cm$^3$ to about 2.4 g/cm$^3$.

In an embodiment, the thin film encapsulation layer may include: a plurality of inorganic thin films; and at least one organic thin film between the plurality of inorganic thin films.

In an embodiment, the at least one inorganic layer may include: a first inorganic layer between the first conductive layer and the second conductive layer; and a second inorganic layer on the first conductive layer and the second conductive layer.

In an embodiment, the at least one inorganic layer may be between the first conductive layer and the second conductive layer, and the organic layer may be directly on the second conductive layer.

In an embodiment, the display apparatus may further include an organic adhesion layer configured to couple the window to the organic light emitting display panel.

In an embodiment, the at least one inorganic layer may be directly on the second conductive layer, and the display apparatus may further include an intermediate insulation layer between the first conductive layer and the second conductive layer.

In an embodiment, the organic layer may include an organic adhesion layer configured to couple the window to the organic light emitting display panel.

In an embodiment, the display apparatus may further include a polarizing film between the at least one inorganic layer and the window.

In an embodiment, the first conductive layer may include bridge parts, and the second conductive layer may include connection parts respectively crossing the bridge parts, first touch sensor parts, where the connection parts respectively connect adjacent first touch sensor parts, and second touch sensor parts, where the bridge parts respectively connect adjacent touch sensor parts.

In an embodiment, the light emitting element layer may include an emission area and a non-emission area adjacent to the emission area, and each of the first touch sensor parts and the second sensor parts may have a mesh pattern and may overlap the non-emission area.

In an embodiment, the first conductive layer may include connection parts, first touch sensor parts, where the connection parts respectively connect adjacent first touch sensor parts, and second touch sensor parts spaced apart from the first touch sensor parts. The second conductive layer may include bridge parts, the bridge parts respectively connecting adjacent second touch sensor parts and respectively crossing the connection parts.

In an embodiment, the first conductive layer may include first connection parts and first touch sensor parts, the first connection parts respectively connecting adjacent first touch sensor parts. The second conductive layer may include second connection parts respectively crossing the first connection parts, and second touch sensor parts, where the second connection parts respectively connect adjacent second touch sensor parts.

In an embodiment, first light reflected by the first conductive layer and second light reflected by the second conductive layer may have a phase difference of about 180° therebetween.

In an embodiment, the at least one inorganic layer may include: a first inorganic layer between the first conductive layer and the second conductive layer and a second inorganic layer on the first conductive layer and the second conductive layer.

In an embodiment, the window may include a plastic film. The organic layer may include an organic adhesion layer contacting the window.

In an embodiment of the inventive concept, a display apparatus may include an organic light emitting display panel, a touch sensing unit, an organic adhesion layer, and a window. The organic light emitting display panel may include a base layer, a circuit layer on the base layer, a light emitting element layer on the circuit layer, and an encapsulation layer on the light emitting element layer. The touch sensing unit may be directly on the thin film encapsulation layer, the organic adhesion layer may be on the touch sensing unit. The window may face the organic light emitting display panel, with the touch sensing unit and the organic adhesion layer being between the window and the organic light emitting display panel.

The touch sensing unit may include: conductive patterns directly on the thin film encapsulation layer; and an insulation layer covering the conductive patterns. The insulation layer may include an inorganic layer having a density of about 2.05 g/cm$^3$ to about 2.4 g/cm$^3$.

In an embodiment of the inventive concept, a display apparatus may include: a display panel including a first inorganic layer; first conductive patterns directly on the first inorganic layer; a first insulation layer covering the first conductive patterns; second conductive patterns directly on the first insulation layer; second insulation layer covering the second conductive patterns; an organic adhesion layer on the second insulation layer; and a window facing the display panel, with the organic adhesion layer being between the window and the display panel. At least one of the first insulation layer and the second insulation layer may include an inorganic layer having a density of about 2.05 g/cm$^3$ to about 2.4 g/cm$^3$.

In an embodiment of the inventive concept, the inorganic layer included in the at least one of the first insulation layer and the second insulation layer may include a silicon nitride layer.

BRIEF DESCRIPTION OF THE DRAWINGS

The accompanying drawings are included to provide a further understanding of the inventive concept, and are incorporated in and constitute a part of this specification. The drawings illustrate example embodiments of the inventive concept and, together with the description, serve to explain principles of the inventive concept. In the drawings.

DETAILED DESCRIPTION

Figure 1A:
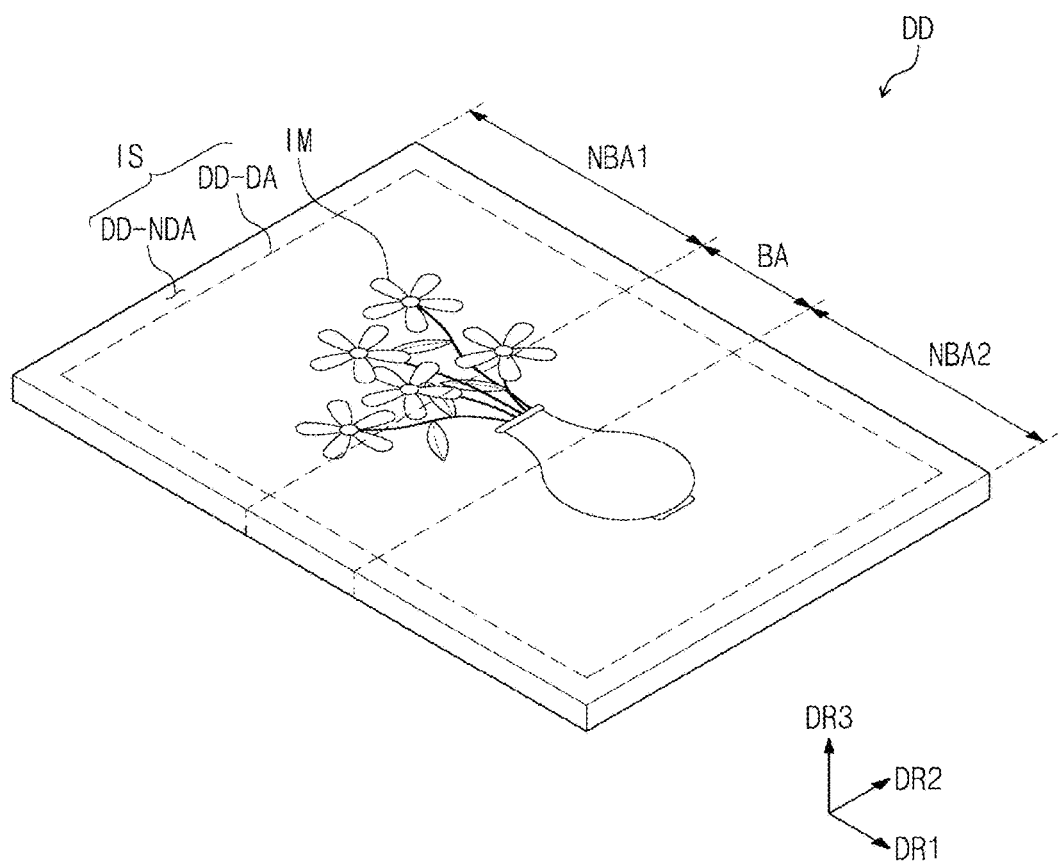
FIG. 1A is a perspective view illustrating a first operation mode of a display apparatus according to an embodiment of the inventive concept.

Hereinafter, embodiments of the inventive concept will be described with reference to the accompanying drawings. In this specification, it will also be understood that when one component (or region, layer, portion) is referred to as being "on", "connected to", or "coupled to" another component, it can be directly on/connected to/coupled to the one component, or one or more intervening components may also be present.

Like reference numerals refer to like elements throughout. Also, in the figures, the thickness, ratio, and dimensions of components are exaggerated for clarity of illustration. The term "and/or" includes any and all combinations of one or more of the associated listed items. Expressions such as "one of" and "selected from," when preceding a list of elements, modify the entire list of elements and do not modify the individual elements of the list. Further, the use of "may" when describing embodiments of the present invention refers to "one or more embodiments of the present invention."

It will be understood that although the terms "first" and "second" are used herein to describe various elements, these elements should not be limited by these terms. The terms are only used to distinguish one component from other components. For example, an element referred to as "a first element" in one embodiment can be referred to as "a second element" in another embodiment, without departing from the scope of the appended claims. The terms in a singular form may include plural forms unless expressly indicated otherwise.

Also, the terms "under", "below", "above', "upper", and the like are used herein for explaining relationship between one or more components illustrated in the drawings. As such, these terms may be relative terms describing the positions of components in the drawings, but the positions of components are not limited thereto.

It will be further understood that the meaning of the terms "include" or "comprise" may specify a property, a fixed number, a step, an operation, an element, a component or a combination thereof, but does not exclude other properties, fixed numbers, steps, operations, elements, components or combinations thereof.

Figure 1B:
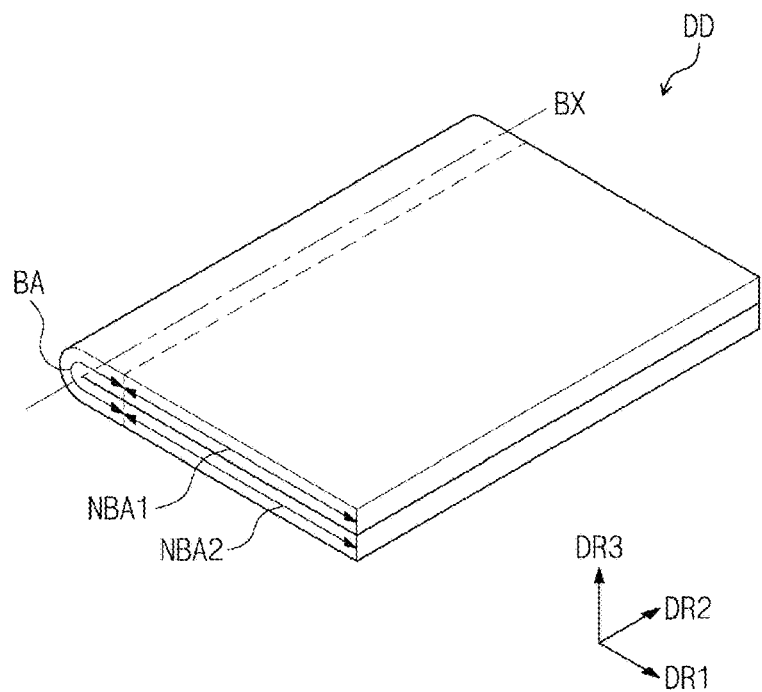
FIG. 1B is a perspective view illustrating a second operation mode of the display apparatus according to an embodiment of the inventive concept.
Figure 1C:
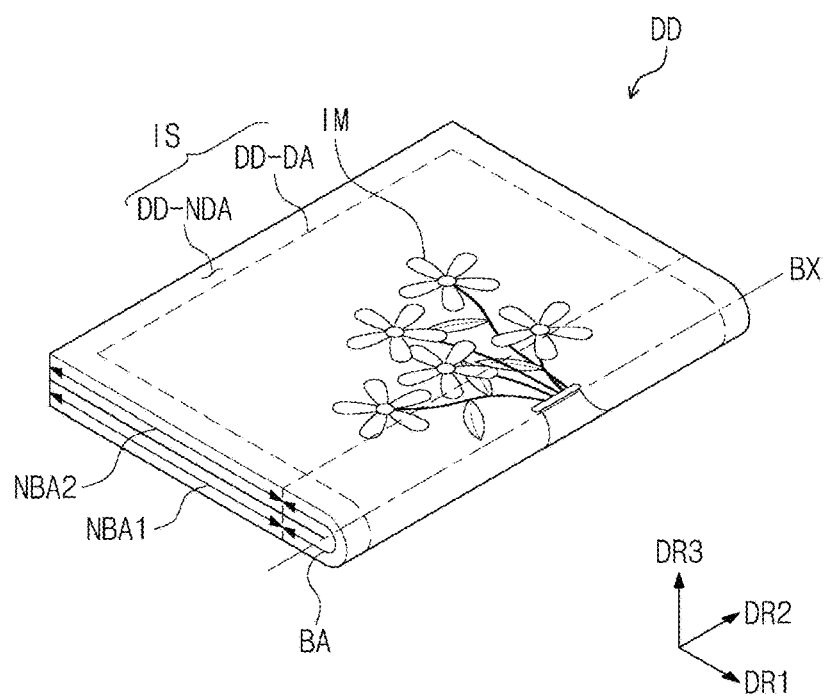
FIG. 1C is a perspective view illustrating a third operation mode of the display apparatus according to an embodiment of the inventive concept.

FIG. 1A is a perspective view illustrating a first operation mode of a display apparatus DD according to an embodiment of the inventive concept. FIG. 1B is a perspective view illustrating a second operation mode of the display apparatus DD according to an embodiment of the inventive concept. FIG. 1C is a perspective view illustrating a third operation mode of the display apparatus DD according to an embodiment of the inventive concept.

As illustrated in FIG. 1A, in a first operation mode, a display surface IS on which an image IM is displayed is parallel to a surface that is defined by a first directional axis DR1 and a second directional axis DR2. A direction normal to the display surface IS (i.e. a thickness direction of the display apparatus DD) is indicated as a third directional axis DR3. A front surface (or top surface) and a rear surface (or bottom surface) of the display apparatus are positioned along the third directional axis DR3. However, directions indicated as the first to third directional axes DR1, DR2, and DR3 may be a relative concept and are not limited to the first to third directional axes illustrated in the drawings. Hereinafter, for convenience of explanation, the first to third directions, as these terms are used herein, may be indicated by the first to third directional axes DR1, DR2, and DR3 and designated by the same reference numerals, respectively.

FIGS. 1A to 1C illustrate a foldable display apparatus as an example of the flexible display apparatus DD. In some embodiments, the display apparatus DD may be a rollable or bendable display apparatus, but not specifically limited thereto. Although a flexible display apparatus is illustrated in the current embodiment, the embodiment of the inventive concept is not limited thereto. The display apparatus DD according to the current embodiment may be a flat rigid display apparatus. The flexible display apparatus DD according to an embodiment of the inventive concept may be used in large-sized electronic devices such as televisions and monitors and small and middle-sized electronic devices such as mobile phones, tablet PC, navigation units for vehicles, game consoles, and smart watches.

As illustrated in FIG. 1A, the display surface IS of the flexible display apparatus DD may include a plurality of areas. The flexible display apparatus DD include a display area DD-DA on which the image IM is displayed and a non-display area DD-NDA that is adjacent to the display area DD-DA. The non-display area DD-NDA may be an area on which an image is not displayed. FIG. 1A illustrates a flower vase as an example of the image IM. For example, the display area DD-DA may have a rectangular shape. The non-display area DD-NDA may surround the display area DD-DA. However, the embodiment of the inventive concept is not limited thereto. For example, the display area DD-DA and the non-display area DD-NDA may have various shapes and positions relative to one another.

As illustrated in FIGS. 1A to 1C, the display apparatus DD may include a plurality of areas defined according to operation modes. The display apparatus DD may include a bent area BA that is bent along a bending axis BX, a first non-bent area NBA1 that is not bent, and a second non-bent area NBA2 that is not bent. As illustrated in FIG. 1B, the display apparatus DD may be bent inward, such that the display surface IS of the first non-bent area NBA1 and the display surface IS of the second non-bent area NBA2 face each other. As illustrated in FIG. 1C, the display apparatus DD may also be bent outward, such that the display surface IS is exposed to the outside.

In an embodiment of the inventive concept, the display apparatus DD may include a plurality of bent areas BA. In addition, the bent areas BA may be defined on the display apparatus DD in accordance with user's operations for manipulating the display apparatus DD. For example, the bent areas BA may be positioned parallel to the first directional axis DR1 or may extend in a diagonal direction. An area of the bent area BA may not be fixed, but may instead be determined according to a curvature radius thereof. In an embodiment of the inventive concept, the display apparatus DD may have a shape in which only operation modes of FIGS. 1A and 1B are repeated.

Figure 2:
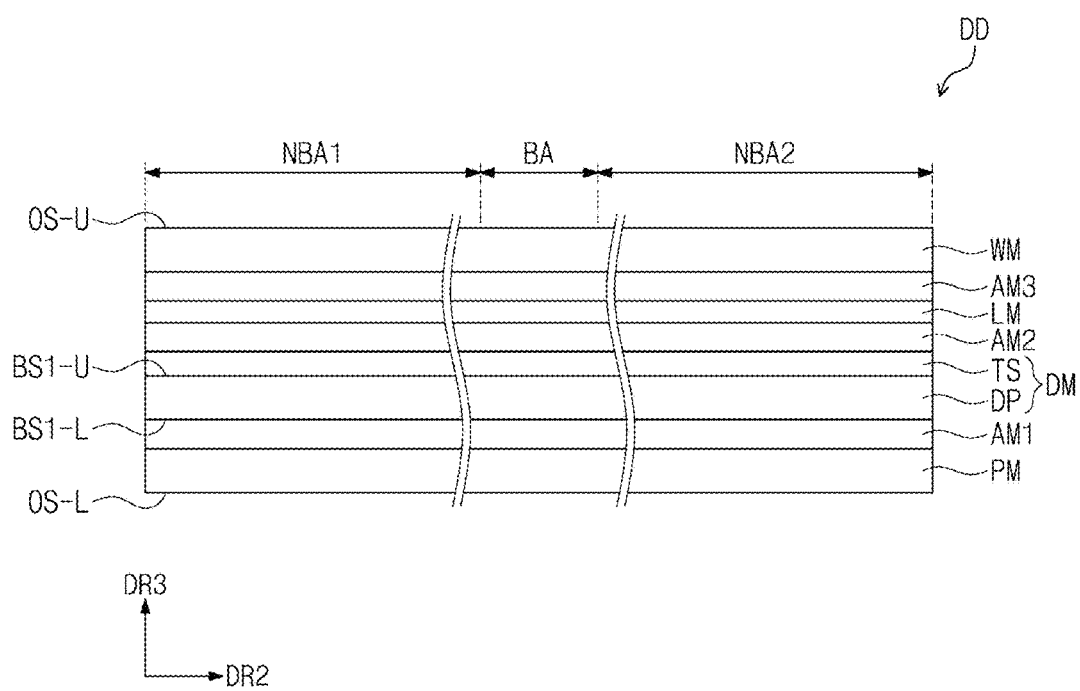
FIG. 2 is a cross-sectional view of the display apparatus according to an embodiment of the inventive concept.

FIG. 2 is a cross-sectional view of the display apparatus DD according to an embodiment of the inventive concept. FIG. 2 illustrates a cross-section defined by the second directional axis DR2 and the third directional axis DR3.

As illustrated in FIG. 2, the display apparatus DD includes a protection film PM, a display module DM, an optical member LM, a window WM, a first adhesion member AM1, a second adhesion member AM2, and a third adhesion member AM3. The display module DM is disposed between the protection film PM and the optical member LM. The optical member LM is disposed between the display module DM and the window WM. The first adhesion member AM1 is coupled to the display module DM and the protection film PM, the second adhesion member AM2 is coupled to the display module DM and the optical member LM, and the third adhesion member AM3 is coupled to the optical member LM and the window WM.

The protection film PM protects the display module DM. The protection film PM provides a first outer surface OS-L that is exposed to the outside and an adhesion surface (opposite the first outer surface OS-L) that adheres to the first adhesion member AM1. The protection film PM may prevent or reduce external moisture from being permeated into the display module DM and may absorb an external impact.

The protection film PM may include a plastic film as a base layer. The protection film PM may include at least one selected from polyethersulphone (PES), polyacrylate (PAR), polyetherimide (PEI), polyethylene naphthalate (PEN), polyethylene terepthalate (PET), polyphenylene sulfide (PPS), polyallylate, polyimide (PI), polycarbonate (PC), poly(arylene ether sulfone), and combinations thereof.

A material for forming the protection film PM is not limited to plastic resins. For example, the protection film PM may include an organic/inorganic composite material. In some embodiments, the protection film PM may include a porous organic layer and an inorganic material that is filled into pores of the organic layer. The protection film PM may further include a functional layer disposed (e.g., positioned) on a plastic film. The functional layer may include a resin layer. The functional layer may be formed in by coating. In an embodiment of the inventive concept, the protection film PM may be omitted.

The window WM may protect the display module DM against external impact and may provide an input surface for a user. The window WM includes a second outer surface OS-U that is exposed to the outside and an adhesion surface (opposite the second outer surface OS-U) that adheres to the third adhesion member AM3. The display surface IS shown in FIGS. 1A to 1C may be the second outer surface OS-U.

The window WM may include a plastic film. In some embodiments, the window WM may include a multilayered structure. For example, the window WM may have a multilayered structure including two or more selected from a glass substrate, a plastic film, and a plastic substrate. The window WM may further include a bezel pattern. The multilayered structure may be formed through a continuous process (e.g., continuous deposition process) or an adhesion process using an adhesion layer.

The optical member LM may reduce reflexibility (e.g., reflection) of external light. The optical member LM may include a polarizing film. The optical member LM may include a phase difference film. In an embodiment of the inventive concept, the optical member LM may be omitted.

The display module DM may include an organic light emitting display panel DP and a touch sensing unit TS. The touch sensing unit TS may be directly disposed on the organic light emitting display panel DP. In this specification, the term "an A1 component is directly disposed on a B1 component" refers to the A1 and B1 components that are being formed through the continuous process (e.g., continuous deposition process). In other words, an adhesion layer is not placed between the A1 component and the B1 component.

The organic light emitting display panel DP may generate an image (see e.g., reference symbol IM of FIG. 1A) corresponding to inputted image data. The organic light emitting display panel DP may include a first display panel surface BS1-L and a second display panel surface BS1-U, which face each other in the thickness direction DR3. Although an example of the organic light emitting display panel DP is described in the current embodiment, the embodiment of the inventive concept is not limited to the above-described display panel.

The touch sensing unit TS may be configured to acquire coordinate information of an external input. In some embodiments, the touch sensing unit TS may sense an external input in a capacitive manner (e.g., the touch sensing unit TS may utilize capacitive sensing).

The display module DM according to an embodiment of the inventive concept may further include a reflection prevention layer. The reflection prevention layer may include a color filer or a laminated structure of a conductive layer/an insulation layer/a conductive layer. The reflection prevention layer may absorb, destructively interfere with, or polarize light incident from the outside in order to reduce reflectance of external light. In some embodiments, the reflection prevention layer may perform the function of the optical member LM.

Each of the first adhesion member AM1, the second adhesion member AM2, and the third adhesion member AM3 may be an organic adhesion layer such as an optically clear adhesive film (OCA), an optically clear resin (OCR), and/or a pressure sensitive adhesive film (PSA). The organic adhesion layer may include an adhesion material such as a polyurethane-based material, a polyacrylic-based material, a polyester-based material, a polyepoxy-based material, and/ or a polyvinyl acetate-based material. As such, the organic adhesion layer may correspond to one of organic layers. As described below, the organic adhesion layer may cause the generation of bubbles.

The display apparatus DD may further include a frame structure that supports the functional layers to maintain the configuration illustrated in FIGS. 1A to 1C. The frame structure may include a joint structure or a hinge structure.

Figure 3A:
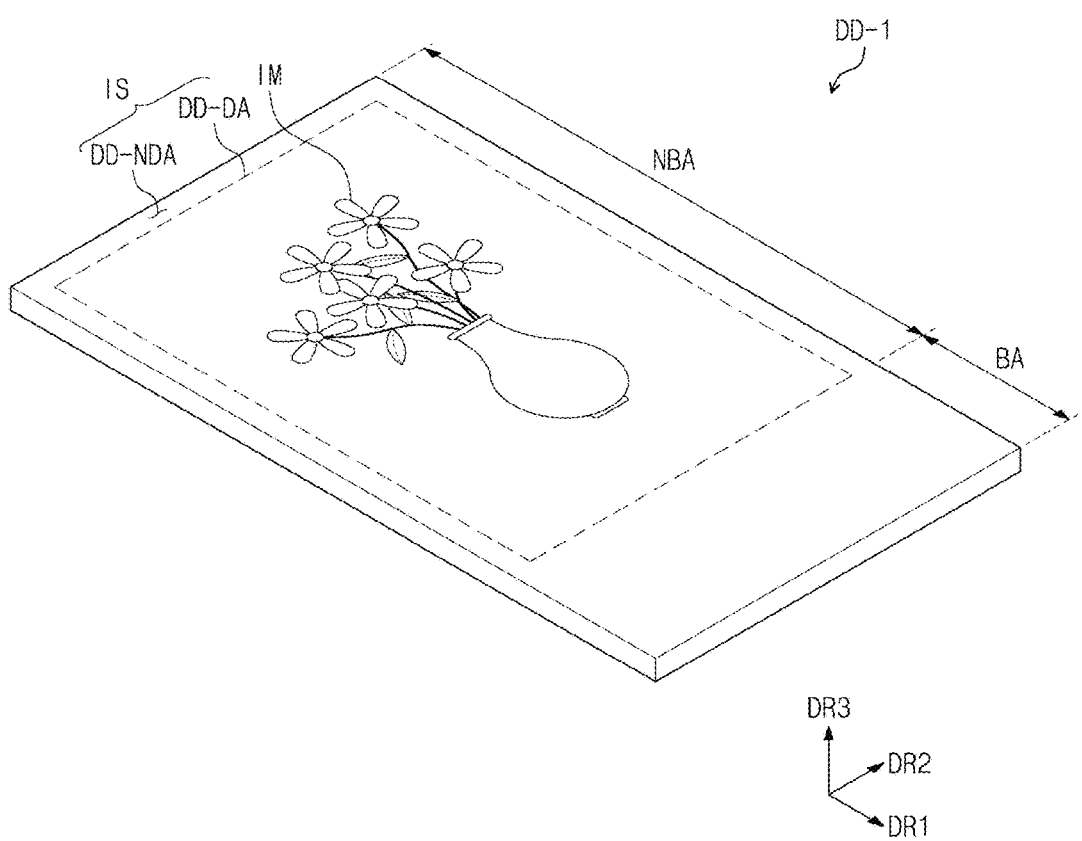
FIGS. 3A and 3B are perspective views of a display apparatus according to an embodiment of the inventive concept.
Figure 3B:
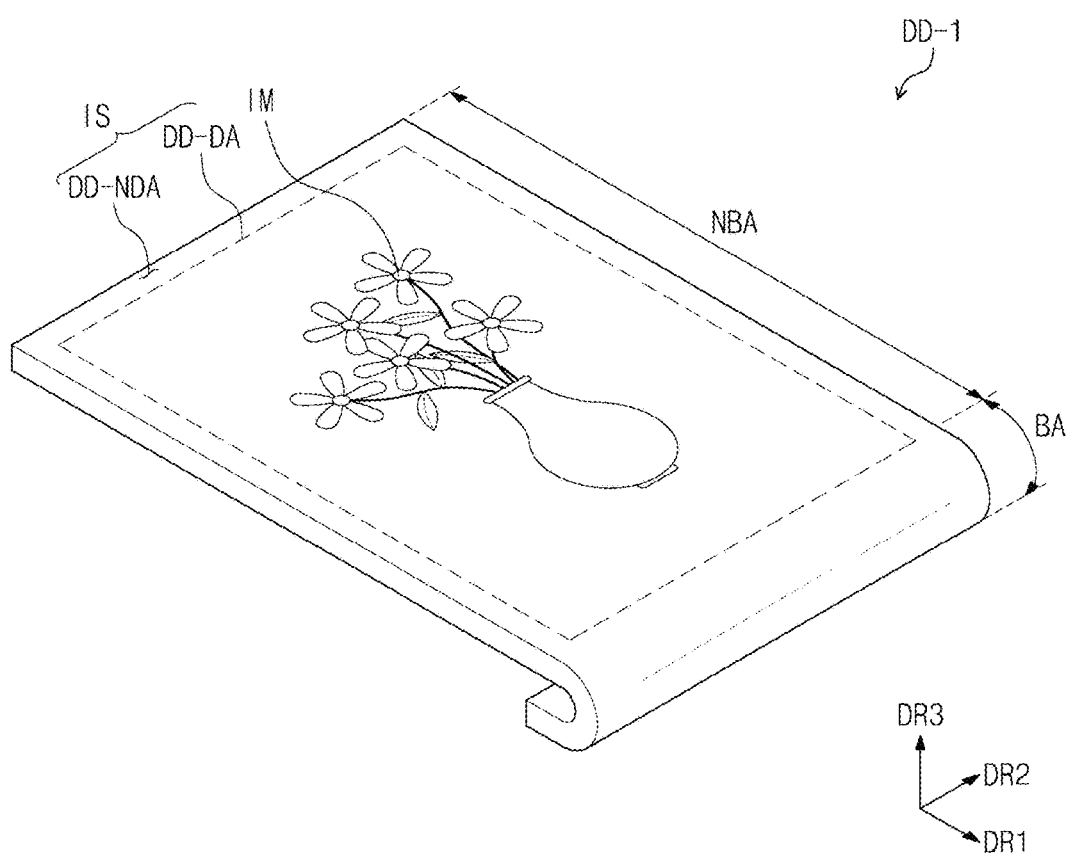

FIGS. 3A and 3B are perspective views of a display apparatus DD-1 according to an embodiment of the inventive concept. FIG. 3A illustrates the display apparatus DD-1 that is in a spread-out state, and FIG. 3B illustrates the display apparatus DD-1 that is in a bent state.

The display apparatus DD-1 may include one bent area BA and one non-bent area NBA. For example, the bent area BA may be positioned in the non-display area DD-NDA of the display apparatus DD-1. However, in an embodiment of the inventive concept, the position of the bent area of the display apparatus DD-1 may be changed.

The display apparatus DD-1 according to an embodiment of the inventive concept may have a fixed shape in which it may operate, unlike the display apparatus DD of FIGS. 1A to 1C. For example, the display apparatus DD-1 may operate in the bent state as illustrated in FIG. 3B. The display apparatus DD-1 may be fixed to a frame in the bent state, and the frame may be coupled to a housing of an electronic device.

The display apparatus DD-1 according to an embodiment of the inventive concept may have the same (or substantially the same) structure as that of the display apparatus DD of FIG. 2. However, the non-bent area NBA and the bent area BA of the display apparatus DD-1 may have laminated structures different from each other. For example, the non-bent area NBA of the display apparatus DD-1 may have the same cross-sectional structure as that of the display apparatus DD of FIG. 2, and the bent area BA of the display apparatus DD-1 may have a cross-sectional structure different from that of the display apparatus DD of FIG. 2. An optical member LM and the window WM of the display apparatus DD-1 may not be disposed in the bent area BA. For example, the optical member LM and the window WM may be disposed only in the non-bent area NBA of the display apparatus DD-1. Also, the second adhesion member AM2 and the third adhesion member AM3 may not be disposed in the bent area BA of the display apparatus DD-1.

Figure 4A:
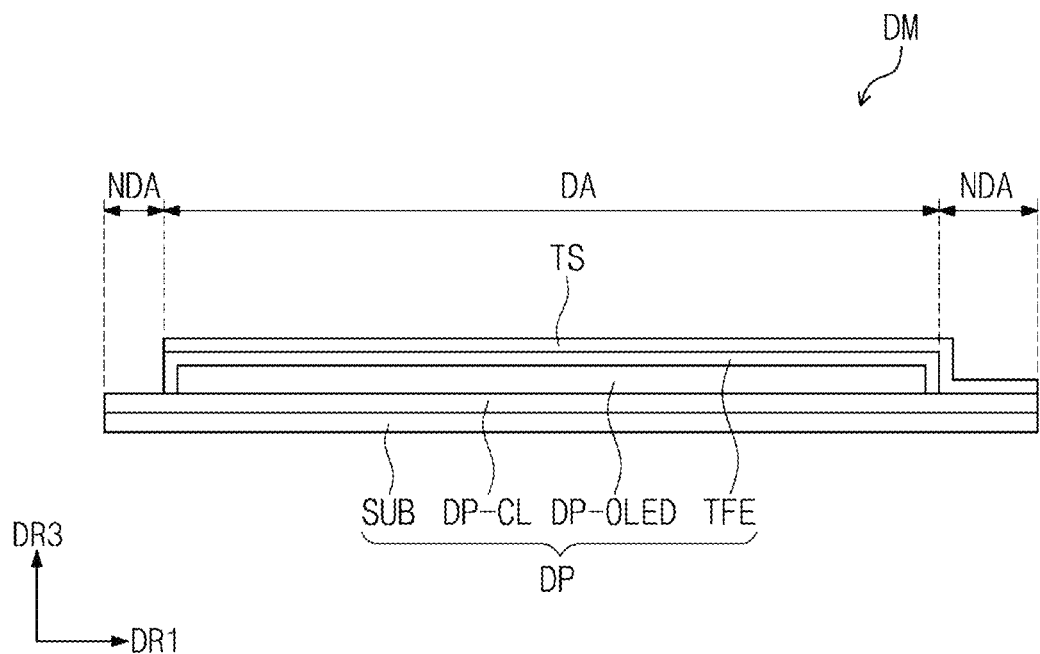
FIG. 4A is a cross-sectional view of a display module according to an embodiment of the inventive concept.
Figure 4B:
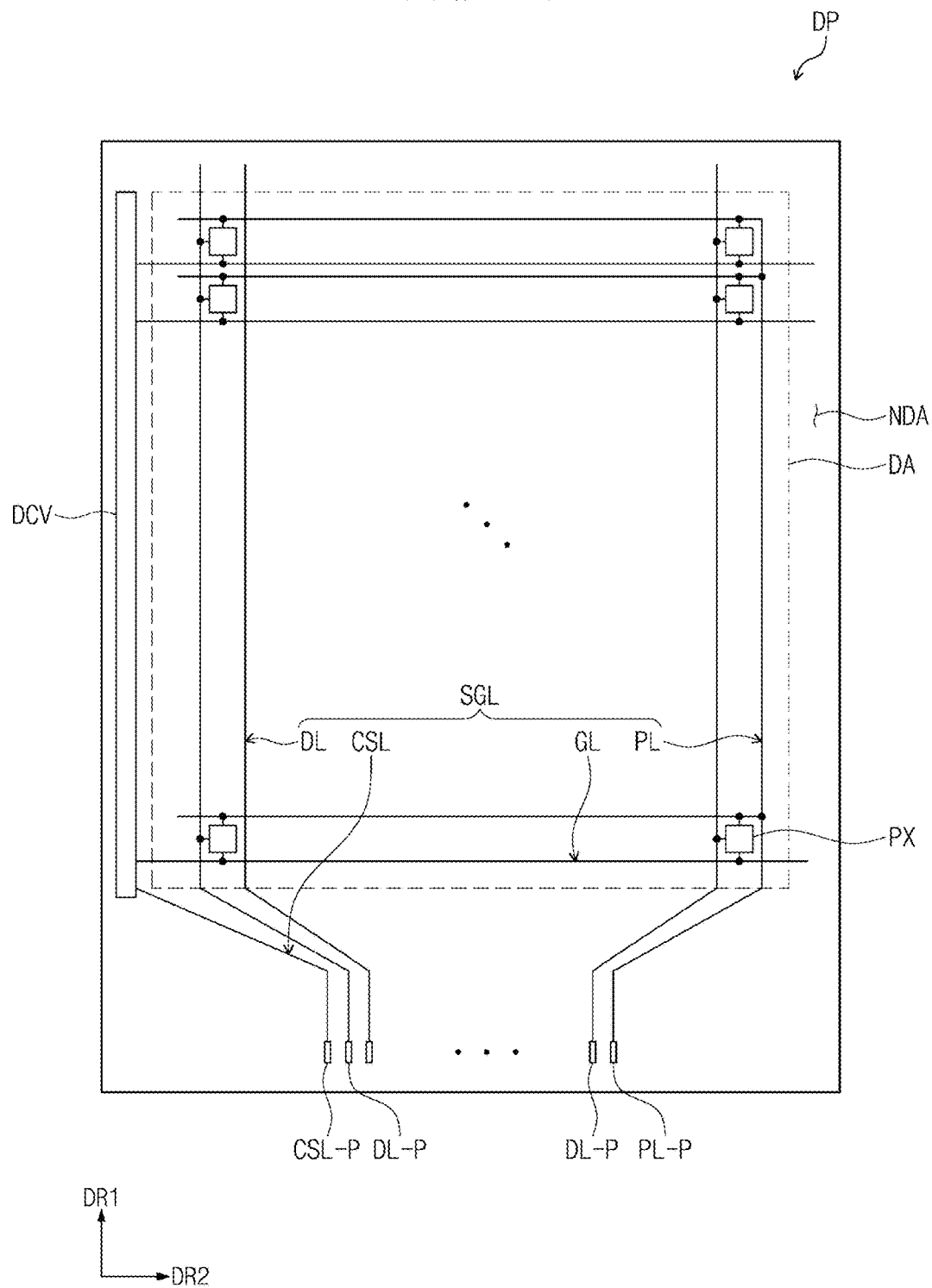
FIG. 4B is a plan view of an organic light emitting display panel according to an embodiment of the inventive concept.
Figure 4C:
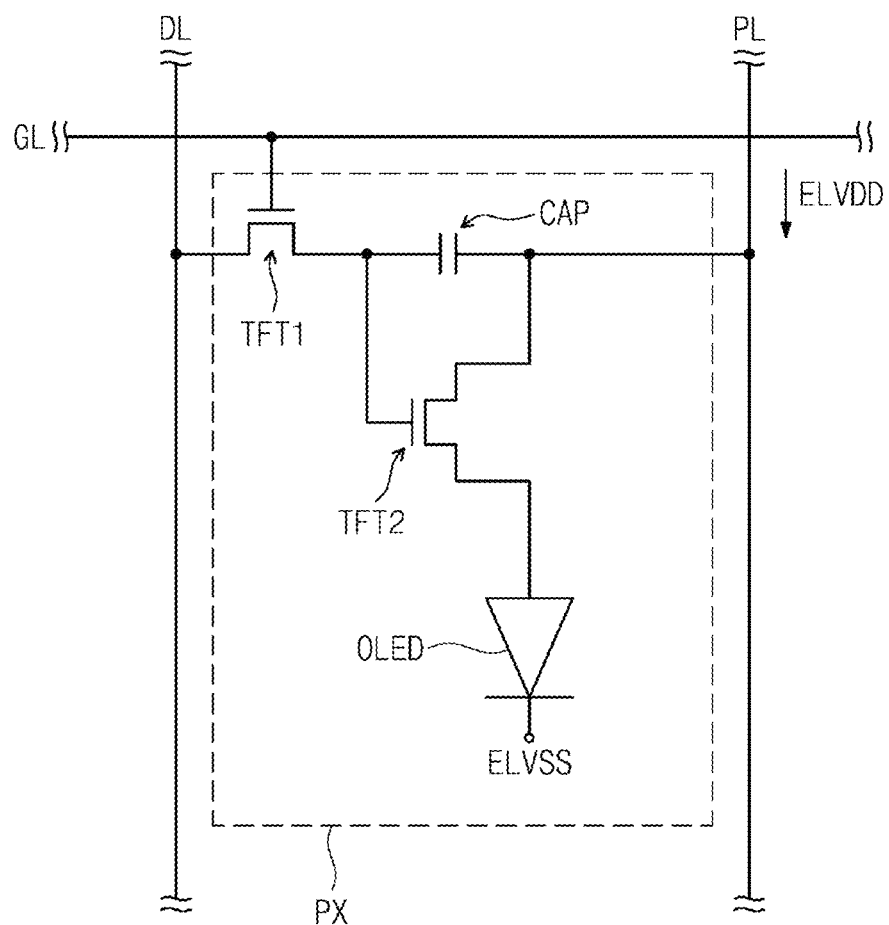
FIG. 4C is an equivalent circuit diagram of a pixel according to an embodiment of the inventive concept.
Figure 4D:
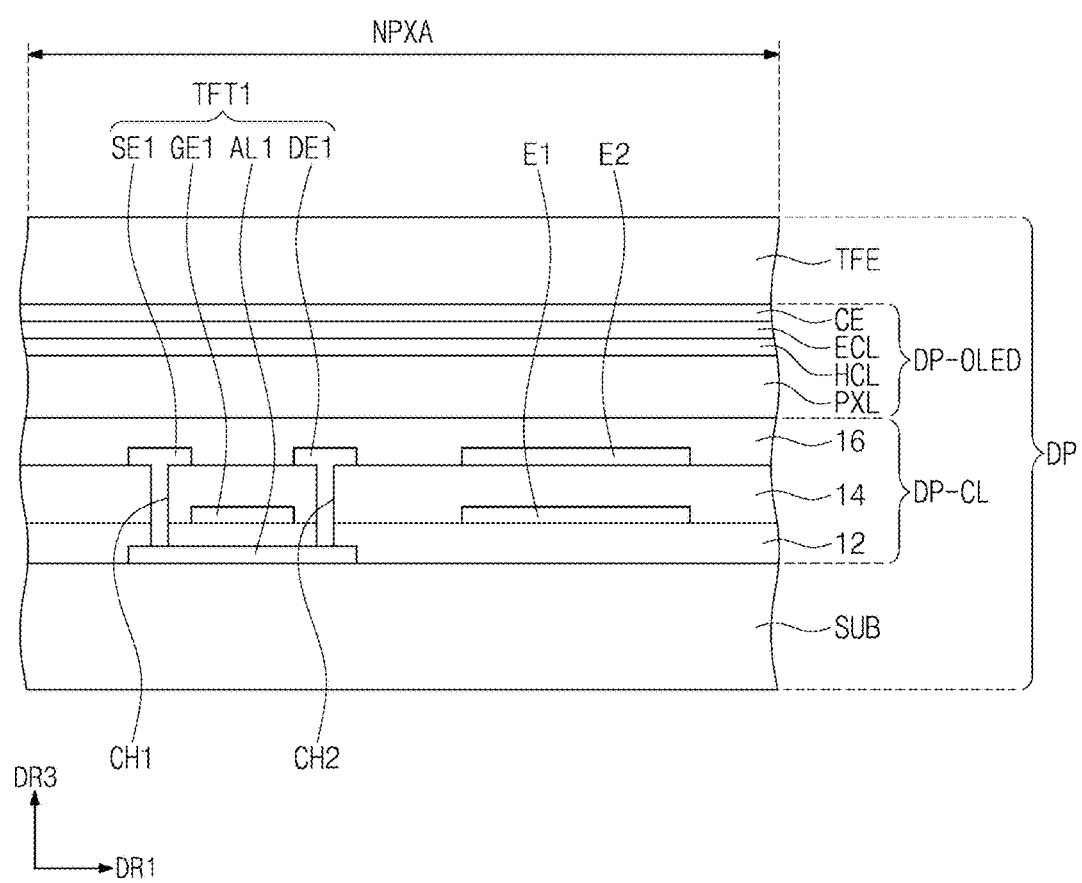
FIGS. 4D and 4E are partial cross-sectional views of an organic light emitting display panel according to an embodiment of the inventive concept.
Figure 4E:
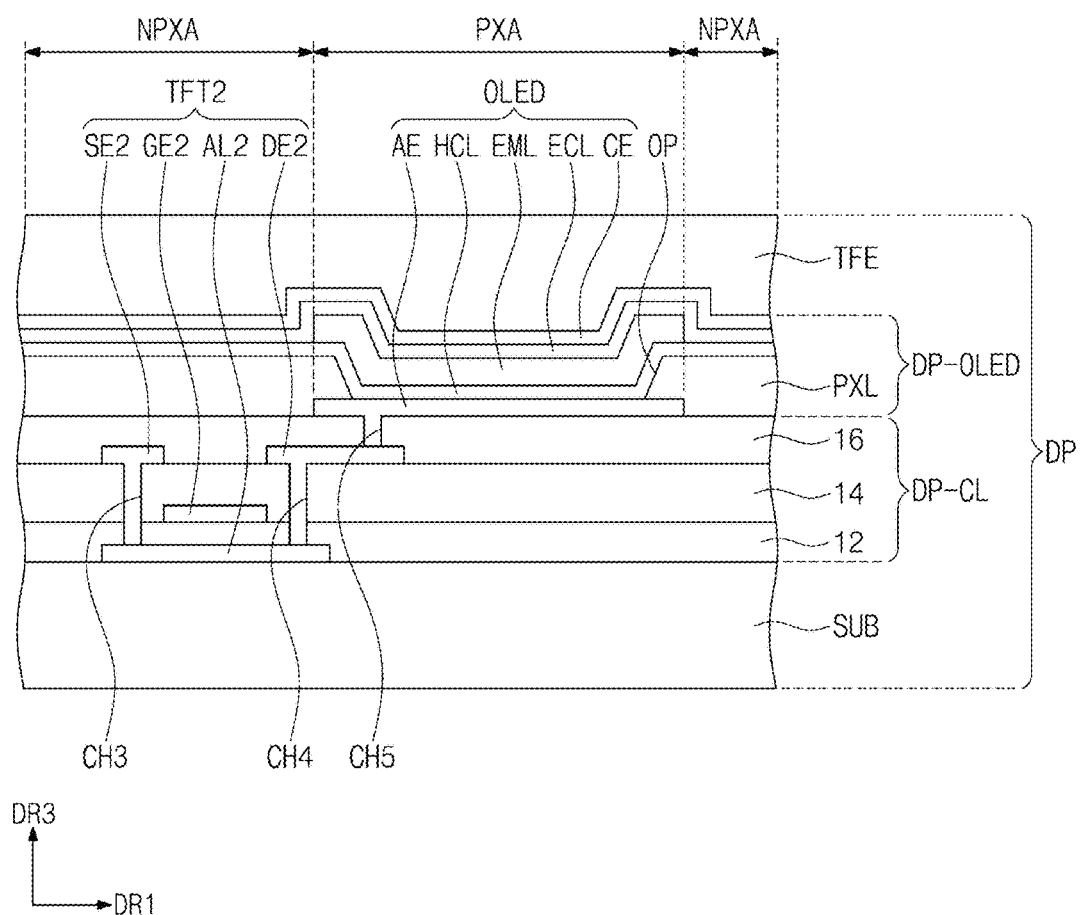

FIG. 4A is a cross-sectional view of a display module DM according to an embodiment of the inventive concept. FIG. 4B is a plan view of the organic light emitting display panel DP according to an embodiment of the inventive concept. FIG. 4C is an equivalent circuit diagram of a pixel PX according to an embodiment of the inventive concept. FIGS. 4D and 4E are partial cross-sectional views of the organic light emitting display panel DP according to an embodiment of the inventive concept.

As illustrated in FIG. 4A, the organic light emitting display panel DP includes a base layer SUB, a circuit layer DP-CL disposed on the base layer SUB, a light emitting element layer DP-OLED, and a thin film encapsulation layer TFE. The base layer SUB may include at least one plastic film. In some embodiments, the base layer SUB may include a plastic substrate, a glass substrate, a metal substrate, and/or an organic/inorganic composite substrate as a flexible substrate.

The circuit layer DP-CL may include a plurality of insulation layers, a plurality of conductive layers, and/or a semiconductor layer. The plurality of conductive layers of the circuit layer DP-CL may constitute signal lines or a control circuit of a pixel. The light emitting element layer DP-OLED may include organic light emitting diodes. The thin film encapsulation layer TFE may seal the light emitting element layer DP-OLED. The thin film encapsulation layer TFE may include at least two inorganic thin films and at least one organic thin film disposed between the at least two inorganic thin films. The inorganic thin films may protect the light emitting element layer DP-OLED against moisture/ oxygen, and the organic thin film may protect the light emitting element layer DP-OLED against foreign substances such as dust particles.

The touch sensing unit TS may be directly disposed on the thin film encapsulation layer TFE. The touch sensing unit TS may include touch sensors and touch signal lines. The touch sensors and the touch signal lines may each independently have a single layer or multilayered structure.

The touch sensors and the touch signal lines may each independently include indium tin oxide (ITO), indium zinc oxide (IZO), zinc oxide (ZnO), and/or indium tin zinc oxide (ITZO), PEDOT, a metal nano wire, and/or graphene. In some embodiments, the touch sensors and the touch signal lines may each independently include a metal layer formed of, for example, molybdenum, silver, titanium, copper, aluminum, and/or an alloy thereof. The touch sensors and the touch signal lines may each independently have the same single-layer structure or may have layer structures different from each other. A more detailed description of the touch sensing unit TS will be provided later.

As illustrated in FIG. 4A, the organic light emitting display panel DP may include a display area DA and a non-display area NDA on a plane. The display area DA and the non-display area NDA of the organic light emitting display panel DP may correspond to the display area DD-DA and the non-display area DD-NDA of the display apparatus DD, respectively. However, embodiments of the present invention are not limited to the display area DA and the non-display area NDA of the organic light emitting display panel DP respectively corresponding to the display area DD-DA and the non-display area DD-NDA of the display apparatus DD. For example, the display area DA and the non-display area NDA of the organic light emitting display panel DP may be changed according to a structure/design of the organic light emitting display panel DP.

As illustrated in FIG. 4B, the organic light emitting display panel DP may include a plurality of signal lines SGL and a plurality of pixels PX. An area on which the plurality of pixels PX are disposed may be defined as the display area DA. In the current embodiment, the non-display area NDA may be defined along an edge of the display area DA.

The plurality of signal lines SGL may include gate lines GL, data lines DL, a power line PL, and a control signal line CSL. The gate lines GL may be connected to corresponding pixels PX of the plurality of pixels PX, and the data lines DL may be connected to corresponding pixels PX of the plurality of pixels PX, respectively. The power line PL may be connected to the plurality of pixels PX. A gate driving circuit DCV to which the gate lines GL are connected may be disposed (e.g., positioned) on one side of the non-display area NDA. The control signal line CSL may provide control signals to the gate driving circuit DCV.

Portions of the gate lines GL, the data lines DL, the power line PL, and the control signal line CSL may be disposed on the same layer, and other portions may be disposed on layers different from each other. Each of the gate lines GL, the data lines DL, the power line PL, and the control signal line CSL may include a signal line unit and a signal pad unit connected to an end of the signal line unit. A control part unit CSL-P, a data pad unit DL-P, and a power pad unit PL-P are illustrated as an example of the signal pad unit. In some embodiments, a gate pad unit may also overlap the gate driving circuit DCV and may be connected to the gate driving circuit DCV.

FIG. 4C illustrates an example of a pixel PX connected to one gate line GL, one data line DL, and the power line PL. However, the embodiment of the inventive concept is not limited to the configuration of the pixel PX illustrated in the figure. For example, the pixel PX may be varied in configuration.

The pixel PX includes an organic light emitting diode OLED as a display device. The organic light emitting diode OLED may be a top emission diode or a bottom emission diode. The pixel PX includes a first transistor TFT1 (e.g., a switching transistor), a second transistor TFT2 (e.g., a driving transistor), and a capacitor CAP as a circuit unit for driving the organic light emitting diode OLED.

The first transistor TFT1 outputs a data signal applied to the data line DL in response to a scanning signal applied to the gate line GL. The capacitor CAP charges a voltage corresponding to the data signal received from the first transistor TFT1.

The second transistor TFT2 is connected to the organic light emitting diode OLED. The second transistor TFT2 controls driving current flowing through the organic light emitting diode OLED to correspond to a charge amount stored in the capacitor CAP. The organic light emitting diode OLED emits light during a turn-on period of the second transistor TFT2.

FIG. 4D is a cross-sectional view of portions corresponding to the first transistor TFT1 and the capacitor CAP of the equivalent circuit of FIG. 4C. FIG. 4E is a cross-sectional view of portions corresponding to the second transistor TFT2 and the organic light emitting diode OLED of the equivalent circuit of FIG. 4C.

As illustrated in FIGS. 4D and 4E, the circuit layer DP-CL is disposed on the base layer SUB. A semiconductor pattern AL1 (hereinafter, referred to as a first semiconductor pattern) of the first transistor TFT1 and a semiconductor pattern AL2 (hereinafter, referred to as a second semiconductor pattern) of the second transistor TFT2 may be disposed on the base layer SUB. The first and second semiconductor patterns AL1 and AL2 may be the same or different, and may each independently be selected from amorphous silicon, polysilicon, and a metal oxide semiconductor.

In some embodiments, functional layers may be further disposed on one surface of the base layer SUB. The functional layers may include at least one selected from a barrier layer and a buffer layer. The first and second semiconductor patterns AL1 and AL2 may each independently be disposed on the barrier layer and/or the buffer layer.

A first insulation layer 12 covering the first and second semiconductor patterns AL1 and AL2 is disposed on the base layer SUB. The first insulation layer 12 includes an organic layer and/or an inorganic layer. For example, the first insulation layer 12 may include a plurality of inorganic thin films. The plurality of inorganic thin films may include a silicon nitride layer and/or a silicon oxide layer.

A control electrode GE1 (hereinafter, referred to as a first control electrode) of the first transistor TFT1 and a control electrode GE2 (hereinafter, referred to as a second control electrode) of the second transistor TFT2 may each independently be disposed on the first insulation layer 12. A first electrode E1 of the capacitor CAP is disposed on the first insulation layer 12. The first control electrode GE1, the second control electrode GE2, and the first electrode E1 may each independently be manufactured by the same photolithograph process as that of the gate lines GL (illustrated in FIG. 4C). For example, the first electrode E1 may be formed of the same material as the gate lines GL, have the same laminated structure as the gate lines GL, and be disposed on the same layer as the gate lines GL.

A second insulation layer 14 covering the first and second control electrodes GE1 and GE2 and the first electrode E1 is disposed on the first insulation layer 12. The second insulation layer 14 includes an organic layer and/or an inorganic layer. For example, the second insulation layer 14 may include a plurality of inorganic thin films. The plurality of inorganic thin films may include a silicon nitride layer and/or a silicon oxide layer.

The data lines DL (illustrated in FIG. 4C) may be disposed on the second insulation layer 14. An input electrode SE1 (hereinafter, referred to as a first input electrode) and an output electrode DE1 (hereinafter, referred to as a first output electrode) of the first transistor TFT1 may be disposed on the second insulation layer 14. An input electrode SE2 (hereinafter, referred to as a second input electrode) and an output electrode DE2 (hereinafter, referred to as a second output electrode) of the second transistor TFT2 may be disposed on the second insulation layer 14. The first input electrode SE1 is branched from a corresponding data line of the data lines DL. The power line PL (illustrated in FIG. 4C)

may be disposed on the same layer as the data lines DL. The second input electrode SE2 may be branched from the power line PL.

A second electrode E2 of the capacitor CAP may be disposed on the second insulation layer 14. The second electrode E2 may be manufactured by the same photolithograph process as that of each of the data lines DL and the power line PL. For example, the second electrode E2 may be formed of the same material, have the same structure, and be disposed on the same layer as that of each of the data line DL and the power line PL.

The first input electrode SE1 and the first output electrode DE1 are connected to the first semiconductor pattern AL1 through first and second through holes CH1 and CH2, which pass through the first and second insulation layers 12 and 14. The first output electrode DE1 may be electrically connected (e.g., coupled) to the first electrode E1. For example, the first output electrode DE1 may be connected to the first electrode E1 through a through hole (not shown) passing through the second insulation layer 14. The second input electrode SE2 and the second output electrode DE2 are connected to the second semiconductor pattern AL2 through third and fourth through holes CH3 and CH4, which pass through the first and second insulation layers 12 and 14. According to another embodiment of the inventive concept, each of the first and second transistors TFT1 and TFT2 may be formed to have a bottom gate structure.

A third insulation layer 16 covering the first input electrode SE1, the first output electrode DE1, the second input electrode SE2, and the second output electrode DE2 may be disposed on the second insulation layer 14. The third insulation layer 16 includes an organic layer and/or an inorganic layer. For example, the third insulation layer 16 may include an organic material to provide a substantially flat surface.

In some embodiments, one of the first, second, and third insulation layers 12, 14, and 16 may be omitted according to the circuit structure of the pixel. Each of the second and third insulation layers 14 and 16 may be an interlayer dielectric layer. The interlayer dielectric layer may be disposed between a lower conductive pattern and an upper conductive pattern to insulate the conductive patterns from each other.

As illustrated in FIGS. 4D and 4E, the light emitting element layer DP-OLED is disposed on the third insulation layer 16. In some embodiments, a pixel defining layer PXL and the organic light emitting diode OLED are disposed on the third insulation layer 16. For example, an anode AE of the organic light emitting diode OLED may be disposed on the third insulation layer 16. The anode AE is connected to the second output electrode DE2 through a fifth through hole CH5 passing through the third insulation layer 16. An opening OP is defined in the pixel defining layer PXL. The opening OP of the pixel defining layer PXL exposes at least a portion of the anode AE.

The light emitting element layer DP-OLED may include an emission area PXA and a non-emission area NPXA that is adjacent to the emission area PXA. For example, the non-emission area NPXA may surround the emission area PXA. In the current embodiment, the emission area PXA is defined to correspond to the anode AE. However, the embodiment of the inventive concept is not limited to the above-described emission area PXA. In some embodiments, the area may be defined as the emission area PXA so long as the light is emitted from the area. In some embodiments, the emission area PXA may be defined to correspond to a portion of the anode AE, which is exposed by the opening OP.

A hole control layer HCL may be commonly defined (e.g., positioned) in the emission area PXA and the non-emission area NPXA. In some embodiments, a common layer such as the hole control layer HCL may be commonly disposed on the plurality of pixels PX (illustrated in FIG. 4B).

An organic light emitting layer EML is disposed on the hole control layer HCL. The organic light emitting layer EML may be disposed only in an area corresponding to the opening OP. For example, the organic light emitting layer EML may be separated from each of the plurality of pixels PX.

An electronic control layer ECL is disposed on the organic light emitting layer EML. A cathode CE is disposed on the electronic control layer ECL. In some embodiments, the cathode CE is commonly disposed on (e.g., over) the plurality of pixels PX.

Although a patterned organic light emitting layer EML is illustrated as an example in the current embodiment (e.g., there is a separate organic light emitting layer EML for each pixel PX), the organic light emitting layer EML may also be commonly disposed on the plurality of pixels PX. In some embodiments, the organic light emitting layer EML may emit white light. Also, the organic light emitting layer EML may have a multilayer structure.

In the current embodiment, the thin film encapsulation layer TFE directly covers the cathode CE. In some embodiments, a capping layer covering the cathode CE may be further disposed, and the thin film encapsulation layer TFE may directly cover the capping layer.

Figure 5A:
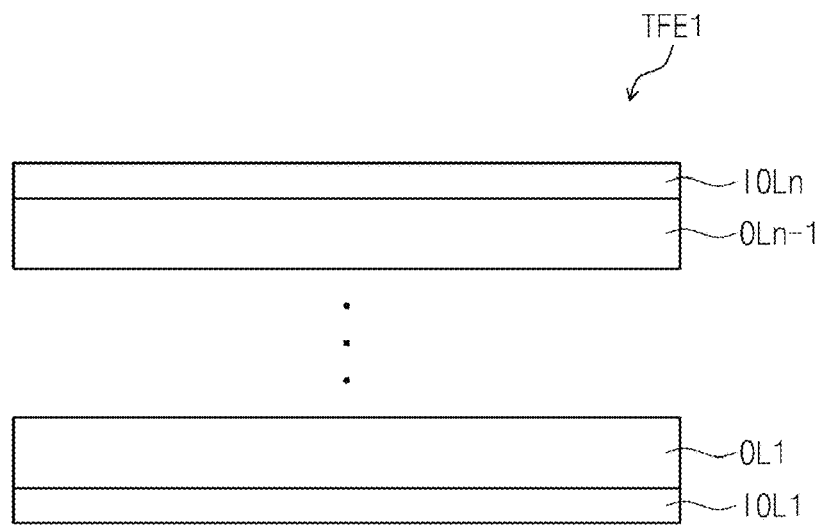
FIGS. 5A to 5C are cross-sectional views of a thin film encapsulation layer according to one or more embodiments of the inventive concept.
Figure 5B:
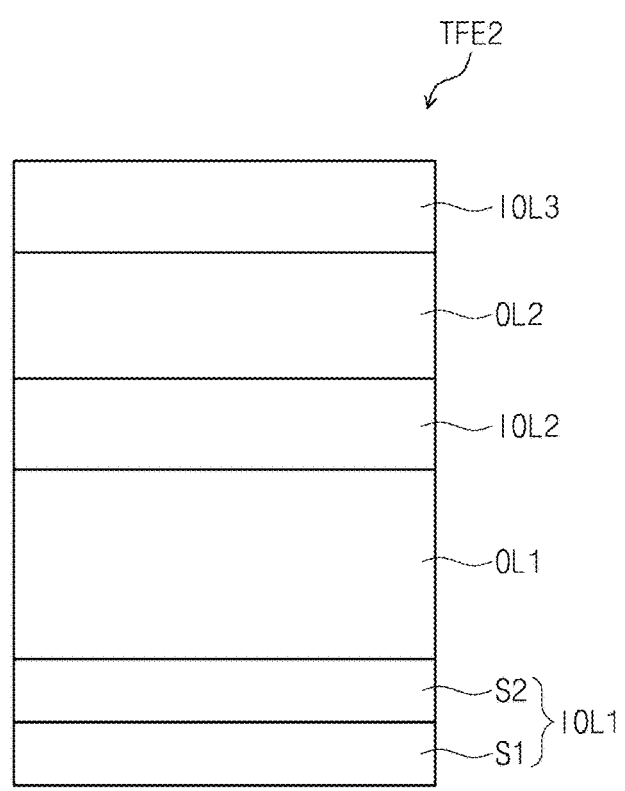
Figure 5C:
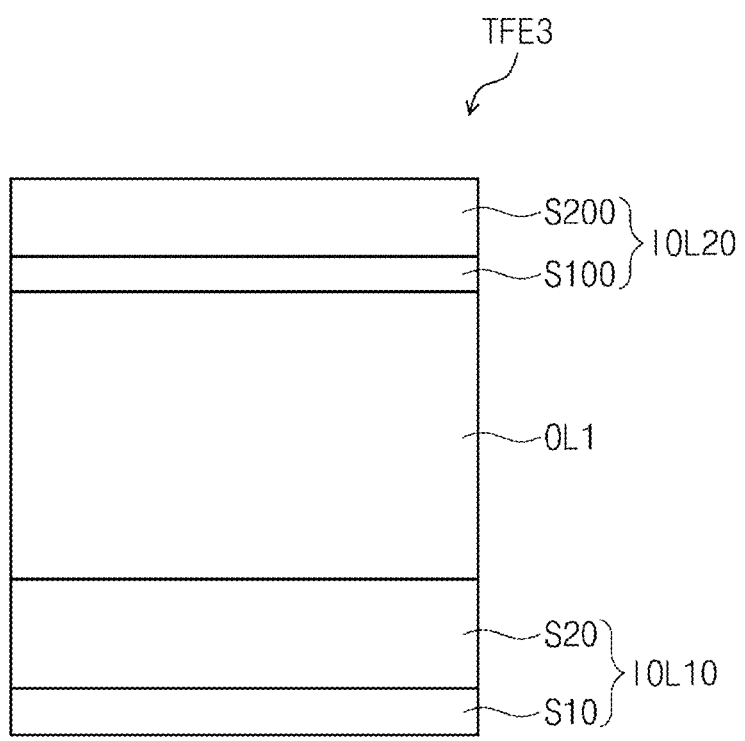

FIGS. 5A to 5C are cross-sectional views of thin film encapsulation layers TFE1, TFE2, and TFE3 according to one or more embodiments of the inventive concept. Hereinafter, the thin film encapsulation layers TFE1, TFE2, and TFE3 according to embodiments of the inventive concept will be described with reference to FIGS. 5A to 5C.

As illustrated in FIG. 5A, the thin film encapsulation layer TFE1 may include n inorganic thin films (e.g., the inorganic thin films may be included in a range of IOL1 to IOLn), with the first inorganic thin film IOL1 contacting the cathode CE (cathode CE is illustrated in, for example, FIG. 4D). The first inorganic thin film IOL1 may be defined as a lower inorganic thin film, and the rest of the inorganic thin films may be defined as upper inorganic thin films.

The thin film encapsulation layer TFE1 includes n−1 organic thin films OL1 to OLn−1. Here, the n−1 organic thin films OL1 to OLn−1 and the n inorganic thin films IOL1 to IOLn may be alternately disposed with respect to each other. Each of the n−1 organic thin films OL1 to OLn−1 may have a thickness greater than that of each of the n inorganic thin films IOL1 to IOLn.

Each of the n inorganic thin films IOL1 to IOLn may has a single layered structure formed of one material or a multi-layered structure respectively formed of materials different from each other. Each of the n−1 organic thin films OL1 to OLn−1 may be formed by depositing organic monomers. The organic monomers may be, for example, acryl-based monomers. In an embodiment of the inventive concept, the thin film encapsulation layer TFE1 may further include an n-th organic thin film (e.g., when the thin film encapsulation layer TFE1 further includes an n-th organic thin film, the total number of organic thin films may be equal to the total number of the inorganic thin films).

Referring now to FIGS. 5B and 5C, the inorganic thin films of each of the thin film encapsulation layers TFE2 and TFE3 may be formed of the same material or materials different from each other and have the same thickness or thicknesses different from each other. The organic thin films of each of the thin film encapsulation layers TFE2 and TFE3 may be formed of the same organic material or organic materials different from each other and have the same thickness or thicknesses different from each other.

As illustrated in FIG. 5B, the thin film encapsulation layer TFE2 may include the first inorganic thin film IOL1, the first organic thin film OL1, the second inorganic thin film IOL2, the second organic thin film OL2, and the third inorganic thin film IOL3, which are successively laminated.

The first inorganic thin film IOL1 may have a two-layered structure. A first sub layer S1 of the first inorganic thin film IOL1 may be a lithium fluoride layer, and a second sub layer S2 may be an aluminum oxide layer. The first organic thin film OL1 may be a first organic monomer layer, the second inorganic thin film IOL2 may be a first silicon nitride layer, the second organic thin film OL2 may be a second organic monomer layer, and the third inorganic thin film IOL3 may be a second silicon nitride layer.

As illustrated in FIG. 5C, the thin film encapsulation layer TFE3 may include a first inorganic thin film IOL10, a first organic thin film OL1, and a second inorganic thin film IOL20, which are successively stacked (or laminated). The first inorganic thin film IOL10 may have a two-layered structure. A first sub layer S10 may be a lithium fluoride layer, and a second sub layer S20 may be a silicon oxide layer. The first organic thin film OL1 may be an organic monomer, and the second inorganic thin film IOL20 may have a two-layered structure. The second inorganic thin film IOL20 may include a first sub layer S100 and a second sub layer S200, which are deposited under deposition environments different from each other. The first sub layer S100 may be deposited under a lower power condition, and the second sub layer S200 may be deposited under a high power condition. Each of the first sub layer S100 and the second sub layers S200 may be a silicon nitride layer.

Figure 6A:
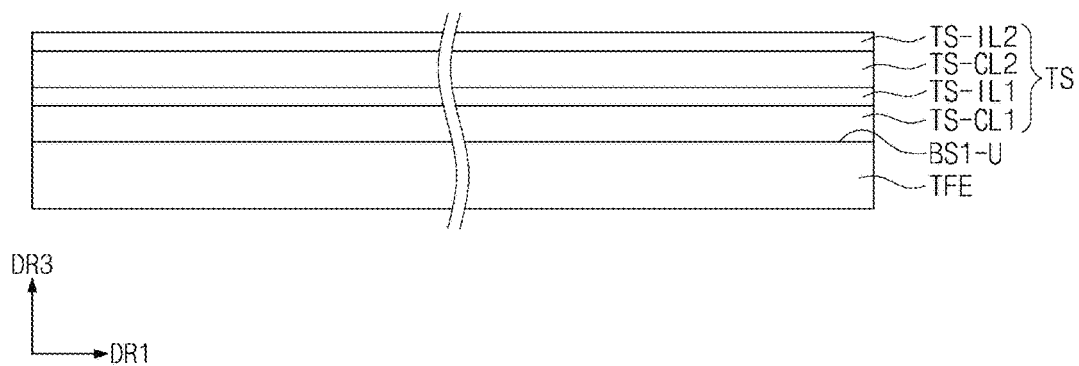
FIG. 6A is a cross-sectional view of a touch sensing unit according to an embodiment of the inventive concept.

FIG. 6A is a cross-sectional view of the touch sensing unit TS according to an embodiment of the inventive concept. FIGS. 6B to 6E are plan views of the touch sensing unit TS according to an embodiment of the inventive concept at different stages (acts/steps) during a manufacturing process.

As illustrated in FIG. 6A, the touch detection layer TS includes a first conductive layer TS-CL1, a first insulation layer TS-IL1 (hereinafter, referred to as a first touch insulation layer), a second conductive layer TS-CL2, and a second insulation layer TS-IL2 (hereinafter, referred to as a second touch insulation layer). The first conductive layer TS-CL1 may be directly disposed on the thin film encapsulation layer TFE. For example, the plastic film, the glass substrate, and/or the plastic substrate may not be disposed between the first conductive layer TS-CL1 and the thin film encapsulation layer TFE.

Each of the first conductive layer TS-CL1 and the second conductive layer TS-CL2 may have a single-layered structure or a multi-layered structure in which a plurality of layers are stacked along the third directional axis DR3. The conductive layer having the multi-layered structure may include a transparent conductive layer and at least two metal layers. The conductive layer having the multi-layered structure may include metal layers formed of metals different from each other. The transparent conductive layer may include indium tin oxide (ITO), indium zinc oxide (IZO), zinc oxide (ZnO), and/or indium tin zinc oxide (ITZO), PEDOT, a metal nano wire, and/or graphene. The metal layer may be formed of molybdenum, silver, titanium, copper, aluminum, and/or an alloy thereof.

Each of the first and second conductive layers TS-CL1 and TS-CL2 may include a plurality of patterns. Hereinafter, a structure in which the first conductive layer TS-CL1 includes first conductive patterns, and the second conducive layer TS-CL2 includes second conductive patterns will be described. Each of the first and second conductive patterns may include touch electrodes and touch signal lines.

Each of the first and second touch insulation layers TS-IL1 and TS-IL2 may be formed of inorganic and/or organic material. The inorganic material may include at least one oxide, such as titanium oxide, silicon oxide, silicon oxide nitride, zirconium oxide and/or hafnium oxide. The organic material may include at least one selected from an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

Each of the first and second touch insulation layers TS-IL1 and TS-IL2 may have a single-layer or a multi-layered structure. Each of the first and second touch insulation layers TS-IL1 and TS-IL2 may include at least one of an inorganic layer and an organic layer. The inorganic layer and the organic layer may each independently be formed through a chemical vapor deposition method.

In the current embodiment, at least one of the first touch insulation layer TS-IL1 and the second touch insulation layer TS-IL2 includes at least one inorganic layer having a density of about 2.05 g/cm$^3$ to about 2.4 g/cm$^3$. This embodiment will be described later in more detail.

In some embodiments, the first touch insulation layer TS-IL1 insulates the first and second conductive layers TS-CL1 and TS-CL2 from each other, but the embodiment of the inventive concept is not limited thereto. The first touch insulation layer TS-IL1 may be formed in any suitable shape, according to the shapes of the first and second conductive patterns. In some embodiments, the first touch insulation layer TS-IL1 may entirely cover the thin film encapsulation layer TFE or may include a plurality of insulation patterns. The plurality of insulation patterns may be enough to overlap first connection parts CP1 and/or second connection parts CP2 (illustrated in, for example, FIGS. 6B-6E).

Although a two-layered touch sensing unit is illustrated as an example in the current embodiment, the embodiment of the inventive concept is not limited thereto. A single layer touch sensing unit may include a conductive layer and an insulation layer covering the conductive layer. The conductive layer may include touch sensors and touch signal lines connected to the touch sensors. The single layer touch sensing unit may acquire coordinate information in a self cap (e.g., self-capacitive) manner.

Figure 6B:
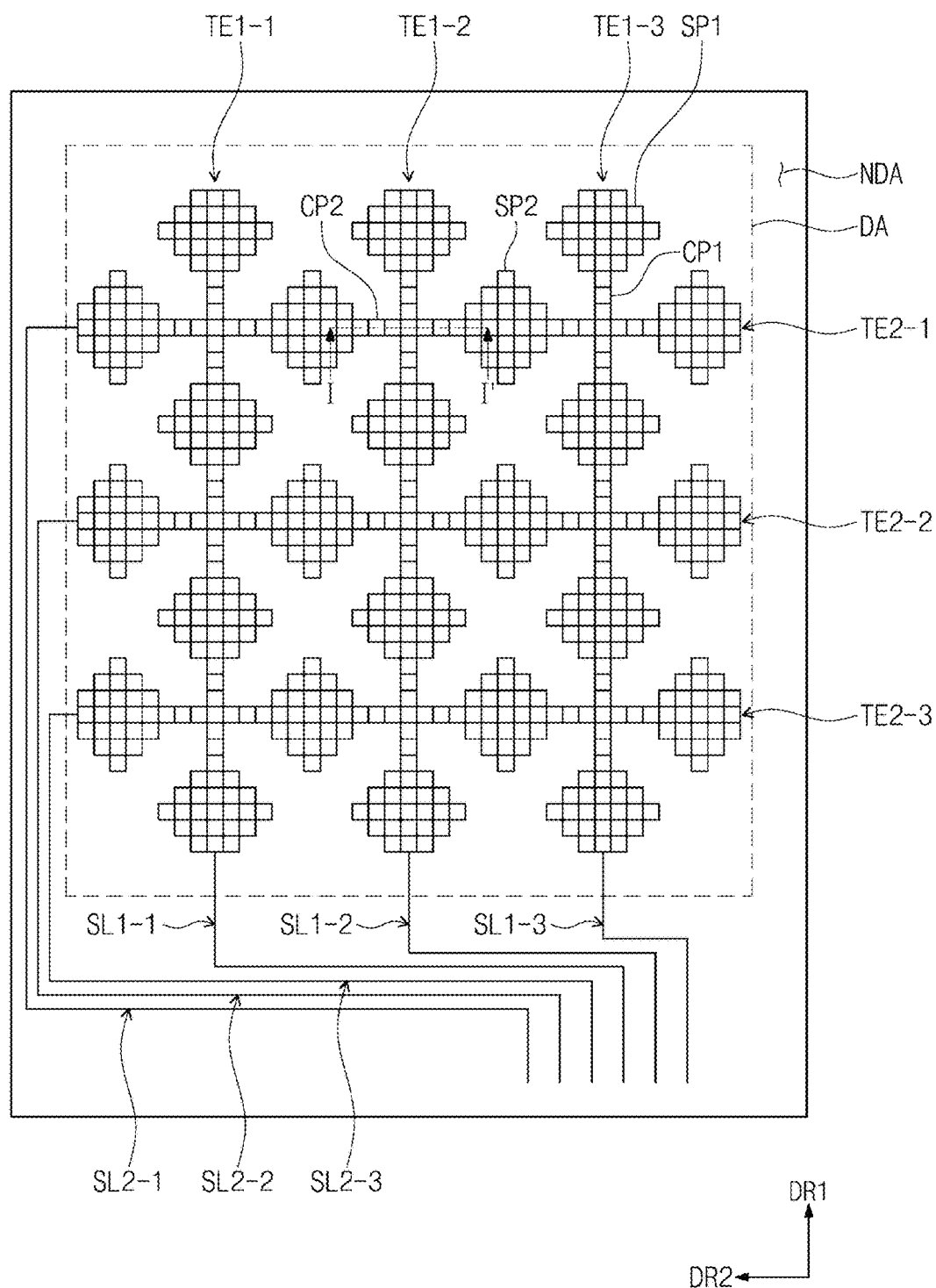
FIGS. 6B to 6E are plan views of the touch sensing unit according to one or more embodiments of the inventive concept.

As illustrated in FIG. 6B, the touch sensing unit TS may include first touch electrodes TE1-1 to TE1-3, first touch signal lines SL1-1 to SL1-3 connected to the first touch electrodes TE1-1 to TE1-3, second touch electrodes TE2-1 to TE2-3, and second touch signal lines SL2-1 to SL2-3 connected to the second touch electrodes TE2-1 to TE2-3. The touch sensing unit TS including three first touch electrodes TE1-1 to TE1-3 and three first touch signal lines SL1-1 to SL1-3 is illustrated as an example.

Each of the first touch electrodes TE1-1 to TE1-3 may have a mesh shape (e.g., a mesh pattern) in which a plurality of touch openings is defined. Each of the first touch electrodes TE1-1 to TE1-3 includes a plurality of first touch sensor parts SP1 and a plurality of connection parts CP1. The first touch sensor parts SP1 are arranged in the first direction DR1. Each of the first connection parts connects two first touch sensor parts SP1, which are adjacent to each other in the first direction DR1, of the first touch sensor parts SP1. In some embodiments, each of the first touch signal lines SL1-1 to SL1-3 may also have a mesh shape (e.g., a mesh pattern).

The second touch electrode TE2-1 and TE2-3 may be insulated from the first touch electrodes TE1-1 to TE1-3 and may cross the first touch electrodes TE1-1 to TE1-3. Each of the second touch electrodes TE2-1 to TE2-3 may have a mesh shape (e.g., a mesh pattern) in which a plurality of touch openings is defined. Each of the second touch electrodes TE2-1 to TE2-3 includes a plurality of second touch sensor parts SP2 and a plurality of second connection parts CP2. The second touch sensor parts SP2 are arranged in the second direction DR2. Each of the second connection parts CP2 connects two second touch sensor parts SP2, which are adjacent to each other in the second direction DR2, of the second touch sensor parts SP2. Each of the second touch signal lines SL2-1 or SL2-3 may also have a mesh shape (e.g., a mesh pattern).

The first touch electrode TE1-1 to TE1-3 and the second touch electrode TE2-1 to TE2-3 may be capacitively coupled to each other. Since touch detection signals are applied to the first touch electrodes TE1-1 to TE1-3, capacitors may be disposed between the respective first touch sensor parts SP1 and the second touch sensor parts SP2.

Portions of the plurality of first touch sensor parts SP1, the plurality of first connection parts CP1, and the first touch signal lines SL1-1 to SL1-3 and portions of the plurality of second touch sensor parts SP2, the plurality of second connection parts CP2, and the second touch signal lines SL2-1 to SL2-3 may be formed by patterning the first conductive layer TS-CL1 of FIG. 6A, and the other portions (e.g., remaining portions of the aforementioned elements) may be formed by patterning the second conductive layer TS-CL2 of FIG. 6A.

To electrically connect (e.g., couple) the conductive patterns disposed on layers different from each other, a contact hole passing through the first touch insulation layer TS-IL1 of FIG. 6A may be defined. Hereinafter, the touch sensing unit TS according to an embodiment of the inventive concept will be described with reference to FIGS. 6C to 6E.

Figure 6C:
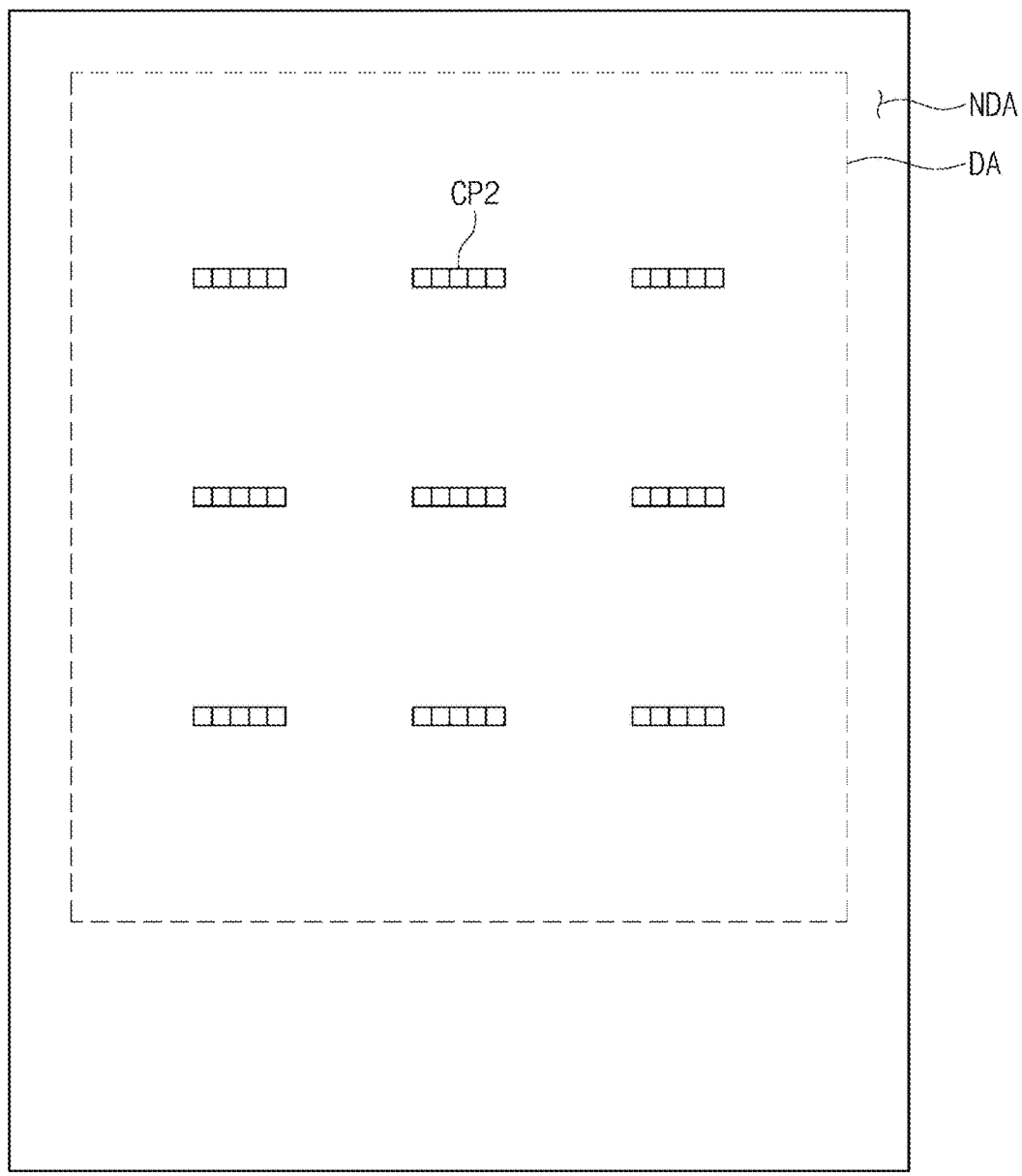

Referring to FIG. 6C, the first conductive patterns may be disposed on the thin film encapsulation layer TFE. The first conductive patterns may include bridge patterns (or bridge parts) CP2. The bridge patterns CP2 may be directly disposed on the thin film encapsulation layer TFE. The thin film encapsulation layer TFE covering the display area DA will be described as an example. The bridge patterns CP2 may correspond to the second connection parts CP2 of FIG. 6B.

Figure 6D:
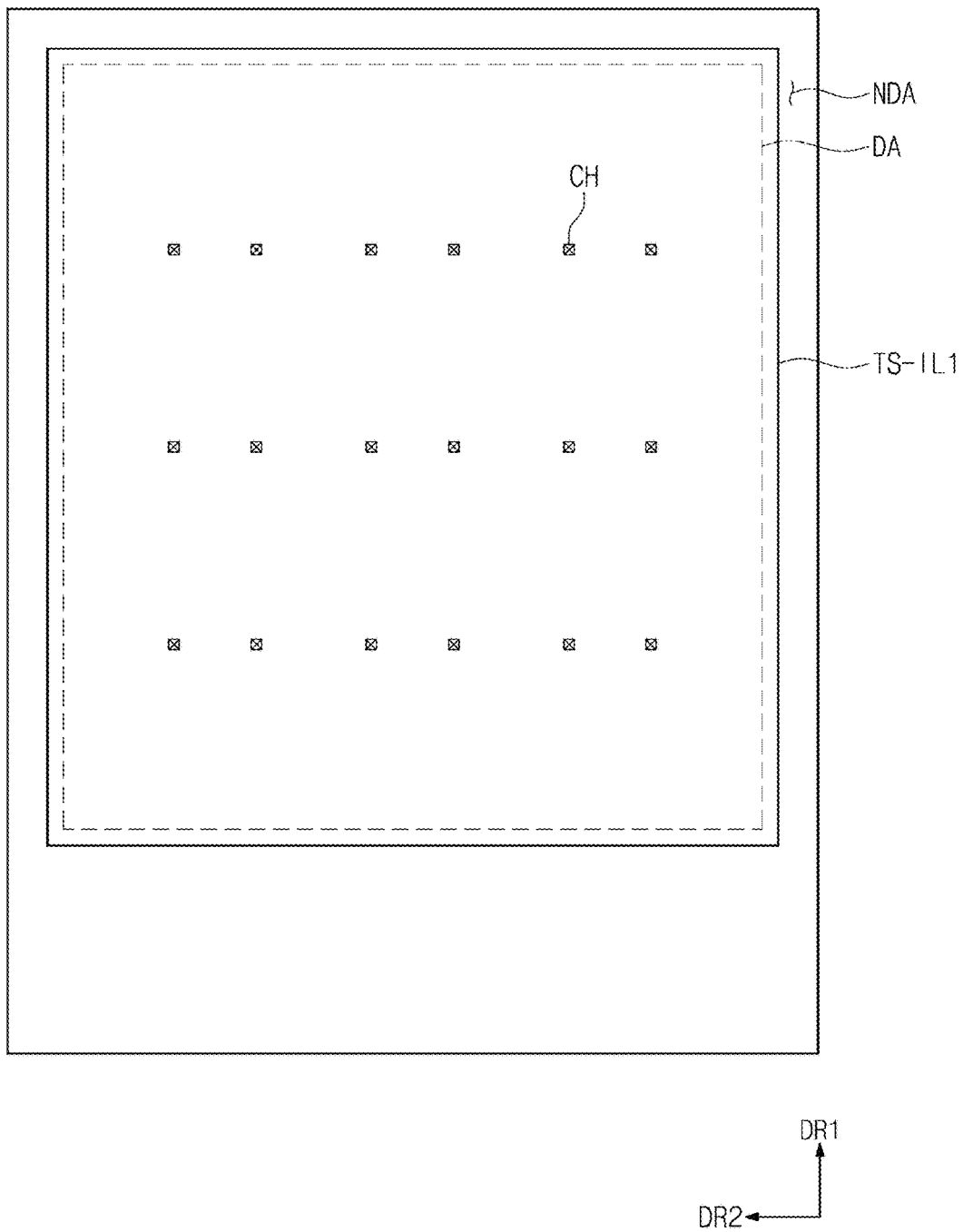

As illustrated in FIG. 6D, the first touch insulation layer TS-IL1 covering the bridge patterns CP2 may then be disposed on the thin film encapsulation layer TFE. Contact holes CH that partially expose the bridge patterns CP2 are defined in the first touch insulation layer TS-IL1. The contact holes CH may be formed through a photolithography process.

Figure 6E:
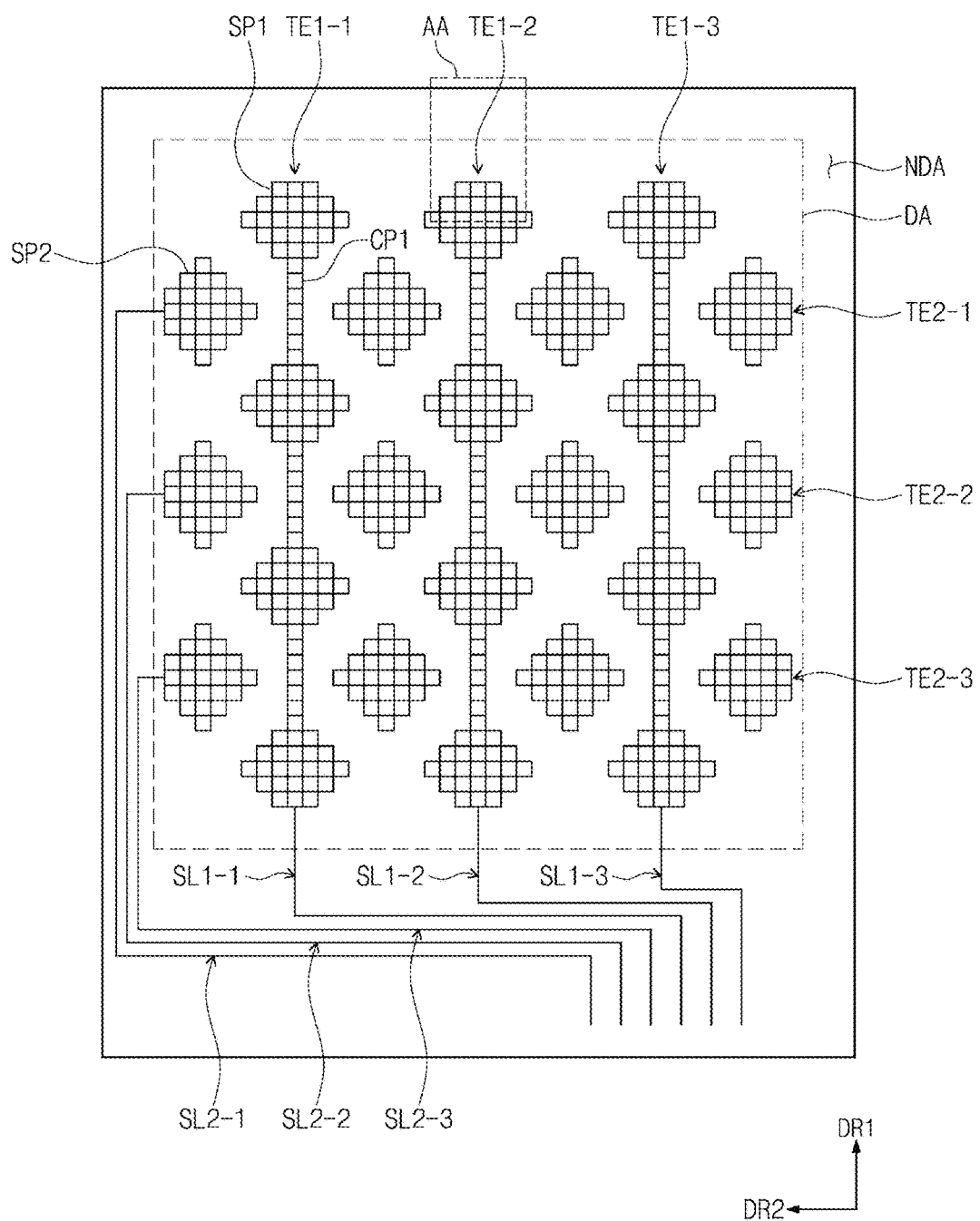

As illustrated in FIG. 6E, the second conductive patterns may then be disposed on the first touch insulation layer TS-IL1. The second conductive patterns may include the plurality of first touch sensor parts SP1, the plurality of first connection parts CP1, the first touch signal lines SL1-1 to SL1-3, the plurality of second touch sensor parts SP2, and the second touch signal lines SL2-1 to SL2-3. In some embodiments, the second touch insulation layer TS-IL2 covering the second conductive patterns is disposed on the first touch insulation layer TS-IL1.

In an embodiment of the inventive concept, the first conductive patterns may include first touch electrodes TE1-1 to TE1-3 and first touch signal lines SL1-1 to SL1-3. The second conductive patterns may include second touch electrodes TE2-1 to TE2-3 and second touch signal lines SL2-1 to SL2-3. In some embodiments, the contact holes CH may not be defined in the first touch insulation layer TS-IL1.

Also, in an embodiment of the inventive concept, the first conductive patterns and the second conductive patterns may be switched with each other. For example, the second conductive patterns may include the bridge patterns CP2.

Figure 7A:
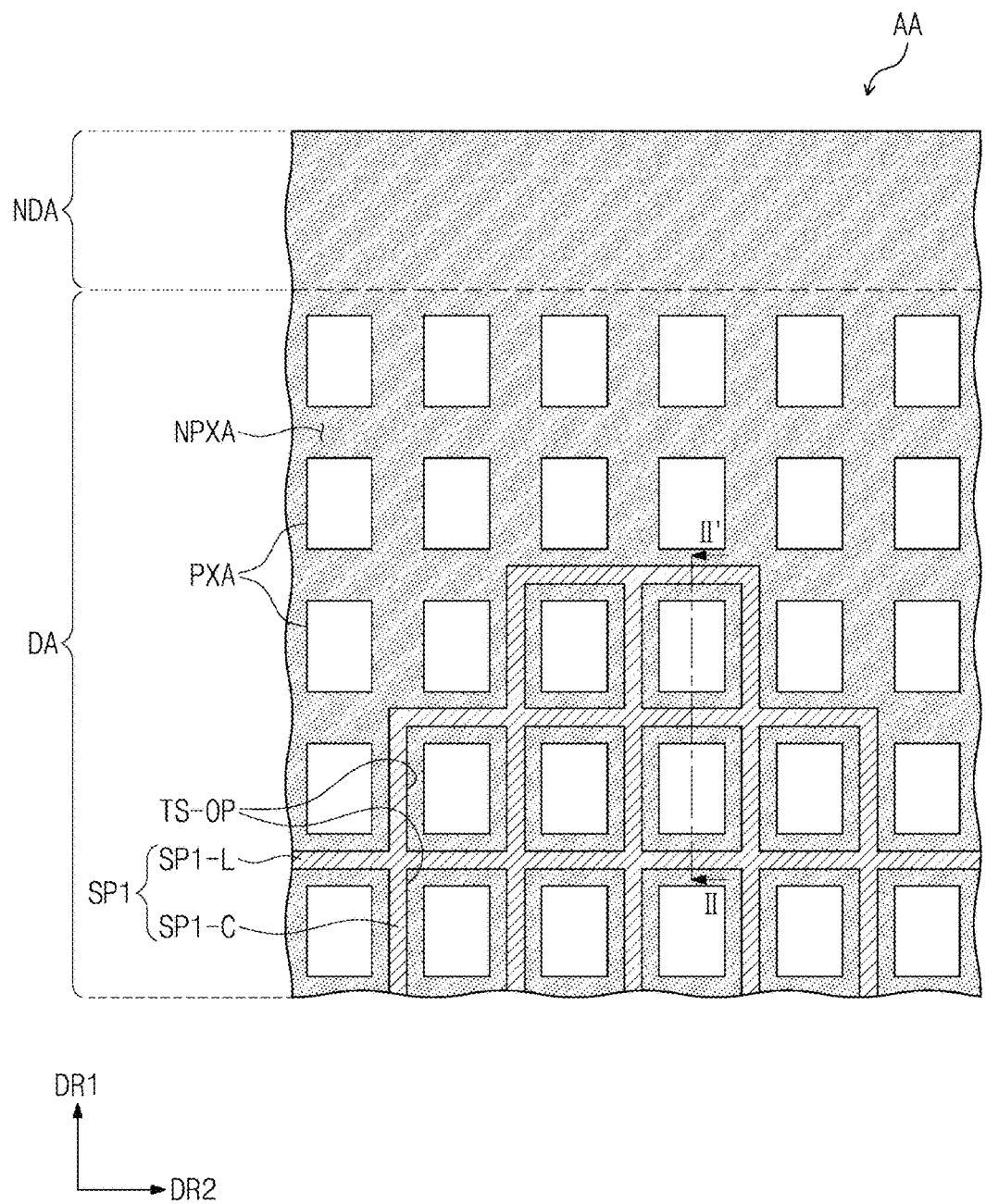
FIG. 7A is a partial enlarged view of an area AA of FIG. 6E.
Figure 7B:
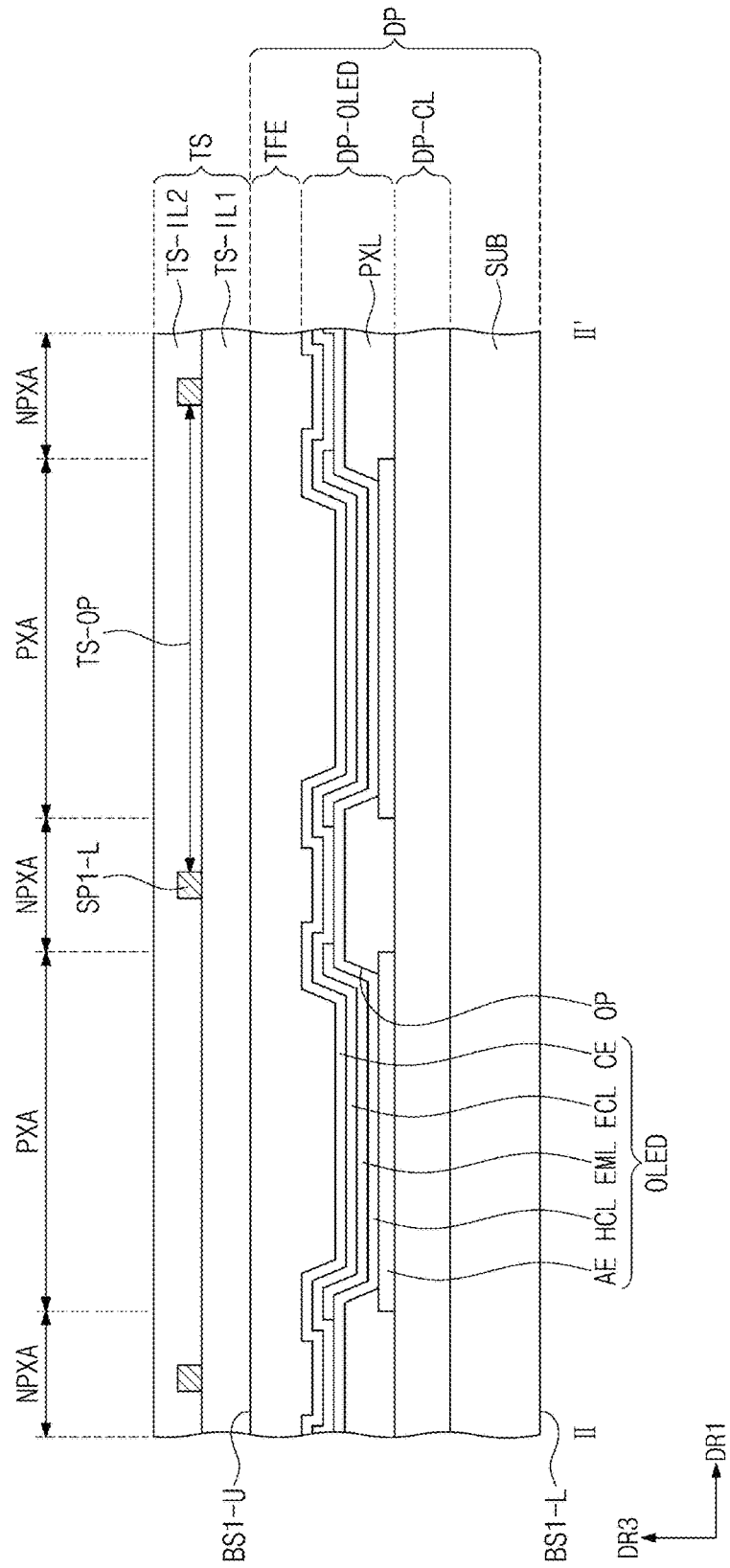
FIG. 7B is a partial cross-sectional view of FIG. 7A.
Figure 7C:
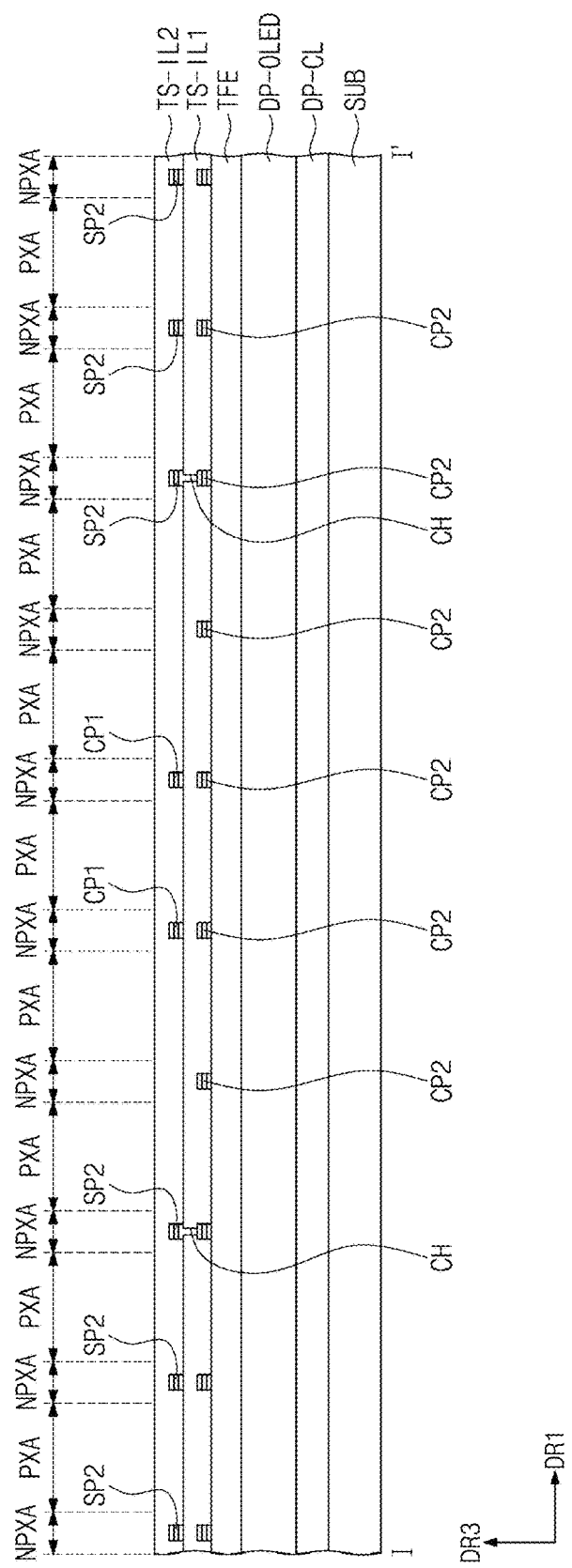
FIG. 7C is a partial cross-sectional view of FIG. 6A.

FIG. 7A is a partial enlarged view of an area AA of FIG. 6E. FIG. 7B is a partial cross-sectional view of FIG. 6A (cut along II-II'). FIG. 7C is a partial cross-sectional view of FIG. 6A (cut along I-I'). Hereinafter, the display module DM will be described in more detail with reference to FIGS. 7A to 7C.

As illustrated in FIG. 7A, the first touch sensor part SP1 overlaps the non-emission area NPXA. The first touch sensor part SP1 includes a plurality of first vertical portions SP1-C extending in the first direction DR1 and a plurality of horizontal portions SP1-L extending in the second direction DR2. The plurality of first vertical portions SP1-C and the plurality of first horizontal portions SP1-L may be defined as a mesh line (e.g., may have a mesh pattern). The mesh line may have a line width of several micrometers.

The plurality of first vertical portions SP1-C and the plurality of first horizontal portions SP1-L may be connected to each other to define a plurality of openings TS-OP. For example, the first touch sensor part SP1 may have a mesh shape (e.g., a mesh pattern) having the plurality of touch openings TS-OP. Although a structure in which the touch openings TS-OP correspond to the emission areas PXA (in a one-to-one relationship) is illustrated, the embodiment of the inventive concept is not limited thereto. One touch opening TS-OP may correspond to two or more emission areas PXA.

Each of the first connection parts CP1, the first touch signal lines SL1-1 to SL1-3, the second touch sensor parts SP2, the second connection parts CP2, and the second touch signal lines SL2-1 to SL2-3 may include horizontal portions and vertical portions.

As illustrated in FIGS. 7B and 7C, the second connection parts CP2 may be directly disposed on the thin film encapsulation layer TFE. The first touch insulation layer TS-IL1 covering the second connection parts CP2 may also be directly disposed on the thin film encapsulation layer TFE (or portions of the first touch insulation layer TS-IL1 may be directly disposed on the thin film encapsulation layer TFE). The first touch insulation layer TS-IL1 overlaps at least the display area DA. The first touch sensor parts SP1, the second touch sensor parts SP2, and the first connection parts CP1 may be directly disposed on the first touch insulation layer TS-IL1.

The second touch insulation layer TS-IL2 (or portions thereof) may be directly disposed on the first touch insulation layer TS-IL1 to cover the first touch sensor part SP1, the second touch sensor parts SP2, and the first connection parts CP1. The second touch insulation layer TS-IL2 overlaps at least the display area DA.

The first touch sensor parts SP1, the first connection parts CP1, the second touch sensor parts SP2, and the second connection parts CP2, which respectively have three-layered structure, are illustrated as an example in FIGS. 7B and 7C. For example, each of the first touch sensor parts SP1, the first connection parts CP1, the second touch sensor parts SP2, and the second connection parts CP2 may have a three-layered structure of titanium/aluminum/titanium.

Figure 8A:
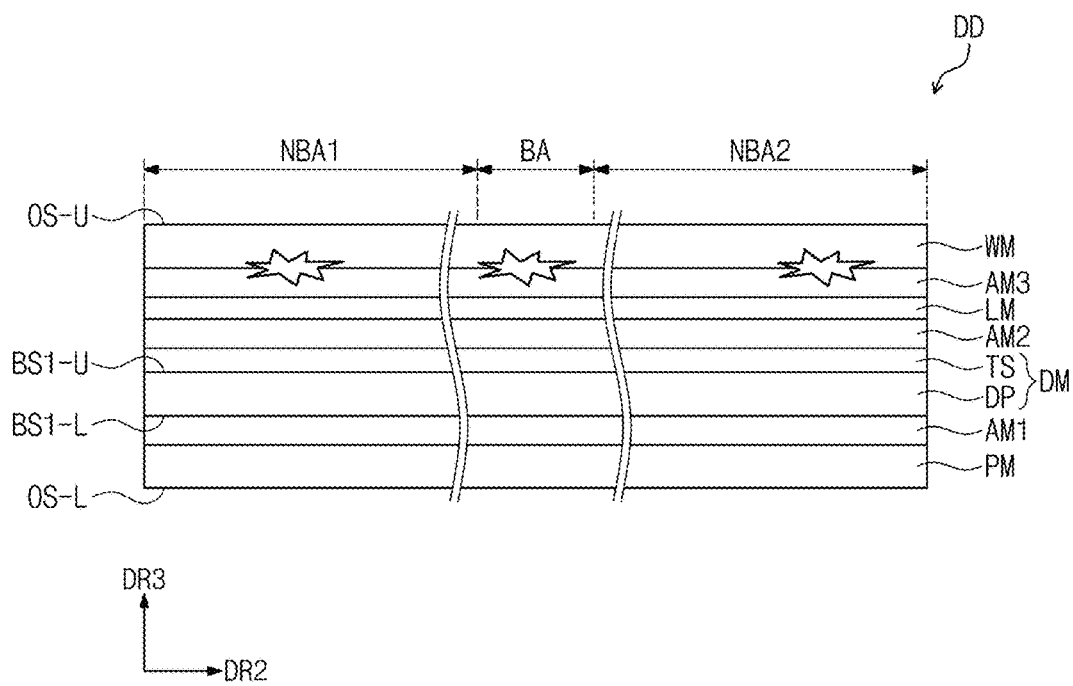
FIG. 8A is a cross-sectional view illustrating bubble defects occurring in the display apparatus.
Figure 8B:
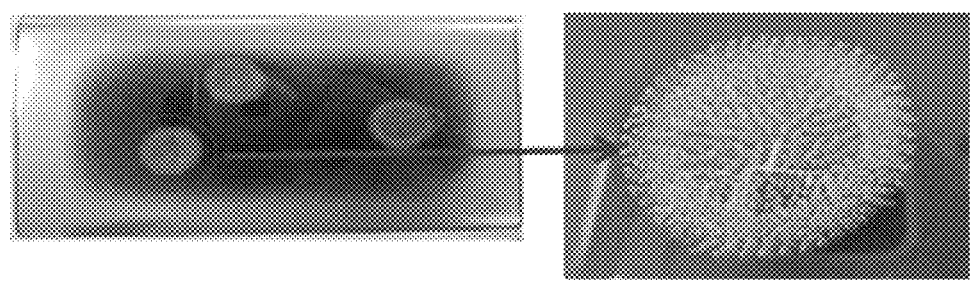
FIG. 8B is a photograph illustrating the bubble defects occurring in the display apparatus.
Figure 9:
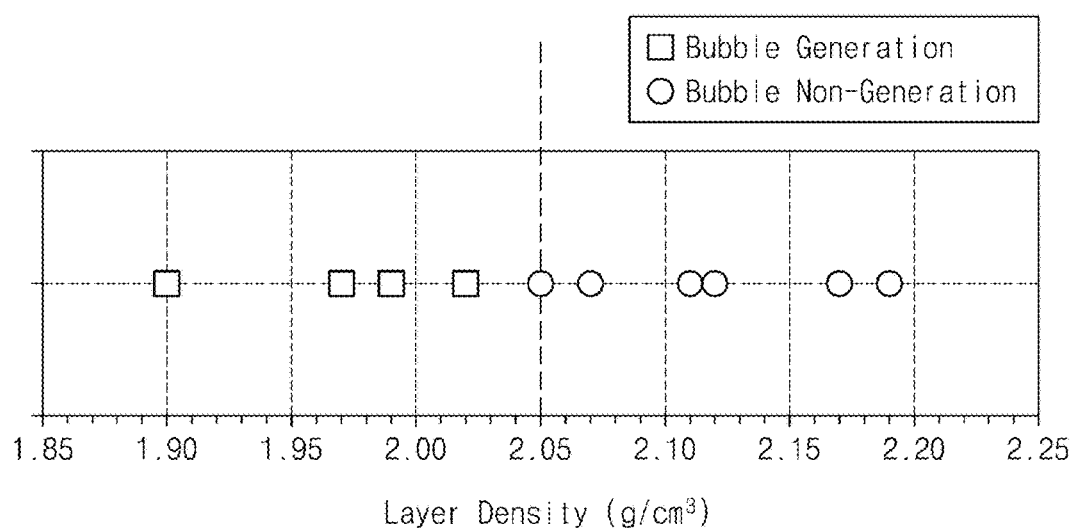
FIG. 9 is a graph illustrating bubble defects depending on a layer density.

FIG. 8A is a cross-sectional view illustrating bubble defects occurring in the display apparatus DD. FIG. 8B is a photograph illustrating the bubble defects occurring in the display apparatus DD. FIG. 9 is a graph illustrating bubble defects depending on a layer density.

A reliability assessment was performed on a display apparatus that was the same as (or substantially the same as) the display apparatus DD of FIG. 2 under severe conditions. The reliability assessment was performed under a temperature of about 80 degrees to about 90 degrees Celsius and humidity of about 80% to about 90%.

As illustrated in FIGS. 8A and 8B, bubbles were collected on an interface between a window WM a third adhesion member AM3. The bubbles were investigated and most were determined to be formed of nitrogen and/or hydrogen. For example, nitrogen and hydrogen may occupy about 80% to about 90% of the bubbles. The bubbles containing a very small amount of carbon dioxide, carbon monoxide, and/or methane were also analyzed.

Samples according to Experimental examples 1 to 8 were manufactured for assessing the reliability of the display apparatus under the severe conditions. Results of the experiments are shown in Table 1 below. In Table 1, "X" indicates the absence of a layer or bubbles, and "O" indicates the presence of a layer or bubbles.

TABLE 1

| | First conductive layer | First touch insulation layer (inorganic layer) | Second conductive layer | Second touch insulation layer (organic layer) | Bubble generation |
|---|---|---|---|---|---|
| Experimental example 1 | X | X | X | X | X |
| Experimental example 2 | O | O | O | O | O |
| Experimental example 3 | O | O | O | X | O |
| Experimental example 4 | O | O | X | X | O |
| Experimental example 5 | O | X | X | X | X |
| Experimental example 6 | X | O | X | X | O |
| Experimental example 7 | X | O | X | X | X |
| Experimental example 8 | X | X | X | O | X |

The Experimental examples 1 to 6 were performed using a display apparatus substantially similar to the one illustrated in FIG. 2. However, the touch sensing units (reference symbol TS of FIG. 6A, for example) were different from each other in structure. In the Experimental example 1, the touch sensing unit TS was omitted. In the Experimental examples 2 to 6, portions of the first touch insulation layer (e.g., the inorganic layer), the second conductive layer, and the second touch insulation layer (e.g., the organic layer) were omitted.

In the Experimental example 7, a glass substrate on which a single layer inorganic layer was formed was applied, instead of the display module (reference symbol DM of FIG. 2, for example). In the Experimental example 8, a glass substrate on which a single layer organic layer was formed was applied, instead of the display module DM.

In the Experimental examples 1 to 8, 1.90 g/cm³ of a silicon nitride layer formed through a chemical vapor deposition (PECVD) method was applied as the first touch insulation layer (the inorganic layer), and an acryl-based organic layer formed through a slit coating method was applied as the second touch insulation layer (the organic layer).

In light of the generation of the bubbles in the Experimental examples 2 to 4 and 6, it is believed, without being bound by any particular theory, that the generation of bubbles is related to the inorganic layer. However, when comparing the Experimental examples 6 (bubbles formed) and 7 (bubbles not formed) to each other (both Experimental examples 6 and 7 having the same layer composition with respect to the first conductive layer, first touch insulation layer, second conductive layer, and second touch insulation layer), it is seen that the generation of bubbles is not dependent on the single condition such as the inorganic layer, but is also related to the thin film encapsulation layer (e.g., in Experimental example 7, the thin film encapsulation layer was not formed). It is presumed that a generation of seed (e.g., bubble seed) is depended on the thin film encapsulation layer and the inorganic layer.

Based on the amount of bubbles generated in the Experimental examples 2 to 4 and 6, it is presumed, without being bound by any particular theory, that the bubbles are not introduced from the outside, but are generated through a reaction between seed and organic materials. It is presumed that the seed is generated when the inorganic layer is formed on the thin film encapsulation layer. The organic materials may be included in the second touch insulation layer or the second adhesion member (reference symbol AM2 of FIG. 2, for example) or the third adhesion member (reference symbol AM3 of FIG. 2, for example).

An additional experiment was performed on the samples according to the Experimental examples 2 and 3. Samples according to Experimental examples 2 and 3 had substantially the same structure, except that the organic layer was not formed in the Experimental example 3. A bubble generation time was measured by using the samples according to the Experimental examples 2 and 3 (four samples each).

TABLE 2

| | 24 (hour) | 120 (hour) | 168 (hour) | 264 (hour) | 336 (hour) | 500 (hour) |
|---|---|---|---|---|---|---|
| Experimental example 3 | 0/4 | 3/4 | 4/4 | 4/4 | 4/4 | 4/4 |
| Experimental example 2 | 3/4 | 4/4 | 4/4 | 4/4 | 4/4 | 4/4 |

The reliability assessment was performed on each of the four samples according to Experimental example 2 and each of the four samples according to Experimental example 3. Although bubbles were not generated after 24 hours in any of the samples of the Experimental example 3, bubbles were generated after 24 hours in three samples of the four samples of the Experimental example 2.

According to the experimental results shown in Table 2 above, it is believed, without being bound by any particular theory, that the organic layer may cause or at least increase the generation of the bubbles. For example, it is believed that the seed may react with the organic materials of the second touch insulation layer or the second adhesion member (reference symbol AM2 of FIG. 2, for example) or the third adhesion member (reference symbol AM3 of FIG. 2, for example) in Experimental example 2. It is believed that the seed may react with the organic materials of the second adhesion member (reference symbol AM2 of FIG. 2, for example) or the third adhesion member (reference symbol AM3 of FIG. 2, for example) in Experimental example 3.

An additional experiment was also performed on the samples of the Experimental examples 9 and 10. Bubble generation time was measured by using the samples according to the Experimental examples 9 and 10 (five samples each). The results are shown in Table 3 below.

TABLE 3

|  | 24 (hour) | 48 (hour) | 72 (hour) | 196 (hour) | 360 (hour) | 500 (hour) |
| --- | --- | --- | --- | --- | --- | --- |
| Experimental example 9 | 0/5 | 0/5 | 1/5 | 1/5 | 2/5 | 2/5 |
| Experimental example 10 | 0/5 | 1/5 | 1/5 | 2/5 | 2/5 | 2/5 |

Each of the samples of the Experimental examples 9 and 10 had the same (or substantially the same) structure as that of the Experimental example 2 (e.g., the same structure as that of the display apparatus illustrated in FIG. 2). In the sample of Experimental example 9, an optically clear adhesive (OCA) manufactured by 3M Purification Inc., was applied as the second adhesion member AM2 and the third adhesion member AM3. In the sample of Experimental example 10, an optically clear adhesive (OCA) manufactured by TMS was applied as the second adhesion member AM2 and the third adhesion member AM3. The OCAs from the above-described manufactures have compositions different from each other.

According to the experimental results shown in Table 3 above, bubble generation times are different depending on the compositions of the adhesion members. Also, it can be seen that the amount of bubbles generated after the same amount of time has passed is also different dependent on the compositions of the adhesion members.

The samples in which the inorganic layer varies in density were manufactured for assessing the reliability. Here, the samples having the same (or substantially the same) structure as that of the Experimental example 2 were manufactured, except the inorganic layer for each sample varied in density.

A silicon nitride layer may be formed by using a mixed gas of silane ($SiH_4$), nitrogen ($N_2$), hydrogen ($H_2$), and ammonia ($NH_3$) through a chemical vapor deposition process. A flow rate for each of the silane ($SiH_4$) and the hydrogen ($H_2$) may have affect the density of the resulting silicon nitride layer. Also, variations in power and pressure within the deposition chamber may affect the density of the silicon nitride layer. In forming the above-described samples, factors believed to have an effect on the composition of the resulting layers were equally maintained among the samples, except that the flow rate of the silane ($SiH_4$) was adjusted to form inorganic layers having different densities according to the samples.

The bar graph illustrated in FIG. 9 represents generation of bubble defects depending on the layer density. In the sample display apparatuses in which the silicon nitride layer has a layer density of about 2.05 $g/cm^3$ or more, bubbles do not appear to be generated.

Without being bound by any particular theory, it is believed that the bubbles are not generated in the samples having the silicon nitride layer density of about 2.05 $g/cm^3$ or more due to non-reaction between the seed and the organic material, because the seed generated while the silicon nitride layer is formed is sealed by the high-density silicon nitride layer.

In contrast, in the display apparatus including the inorganic layer having the layer density of about 2.05 $g/cm^3$ or less, the seeds may pass through a low-density inorganic layer to reach the second touch insulation layer TS-IL2 and the organic adhesion layers (e.g., reference symbols AM2 and AM3 of FIG. 2). In this case, it is believed that the seeds react with the second touch insulation layer TS-IL2 and the organic adhesion layers AM2 and AM3 to generate bubbles.

When the bubbles are generated in the second touch insulation layer TS-IL2, they may pass through the second adhesion member AM2, the optical member LM, and the third adhesion member AM3, and then are collected on an interface between the window WM and the third adhesion member AM3. Also, when the bubbles are generated in the second adhesion member AM2 and the third adhesion member AM3, they also may be collected on the interface between the window WM and the third adhesion member AM3.

As the inorganic layer gradually increases in density, flexibility of the layer gradually decreases. Thus, the inorganic layer may have a density of about 2.4 $g/cm^3$ or less. When the inorganic layer has a density within this range, the generation of cracks in the inorganic layer, caused by stress applied from the outside, may be prevented or reduced.

In the current embodiment, at least one of the first touch insulation layer TS-IL1 and the second touch insulation layer TS-IL2, as these layers are described with, for example, reference to FIG. 6A, may include at least one inorganic layer having a density of about 2.05 $g/cm^3$ to about 2.4 $g/cm^3$. Here, the generation of the above-described bubbles may be suppressed or reduced, and the occurrence of the cracks in the first touch insulation layer TS-IL1 and the second touch insulation layer TS-IL2 may be prevented or reduced.

In an embodiment of the inventive concept, each of the first touch insulation layer TS-IL1 and the second touch insulation layer TS-IL2 may include the silicon nitride layer having the above-described density.

In an embodiment of the inventive concept, the first touch insulation layer TS-IL1 may include the silicon nitride layer having the above-described density. Here, the second touch insulation layer TS-IL2 may be an organic layer. When an inorganic layer having a density less than the above-described density is formed, bubbles may be generated during the formation of the second touch insulation layer TS-IL2. To prevent or reduce the possibility of the bubbles being generated and to improve flexibility, the second touch insulation layer TS-IL2 may be an organic layer.

In an embodiment of the inventive concept, the second touch insulation layer TS-IL2 may include the silicon nitride layer having the above-described density. When the second touch insulation layer TS-IL2 has a multi-layered structure, the silicon nitride layer having the above-described density may be the uppermost layer. Here, the first touch insulation layer TS-IL1 may include an organic layer and/or inorganic layer.

Figure 10A:
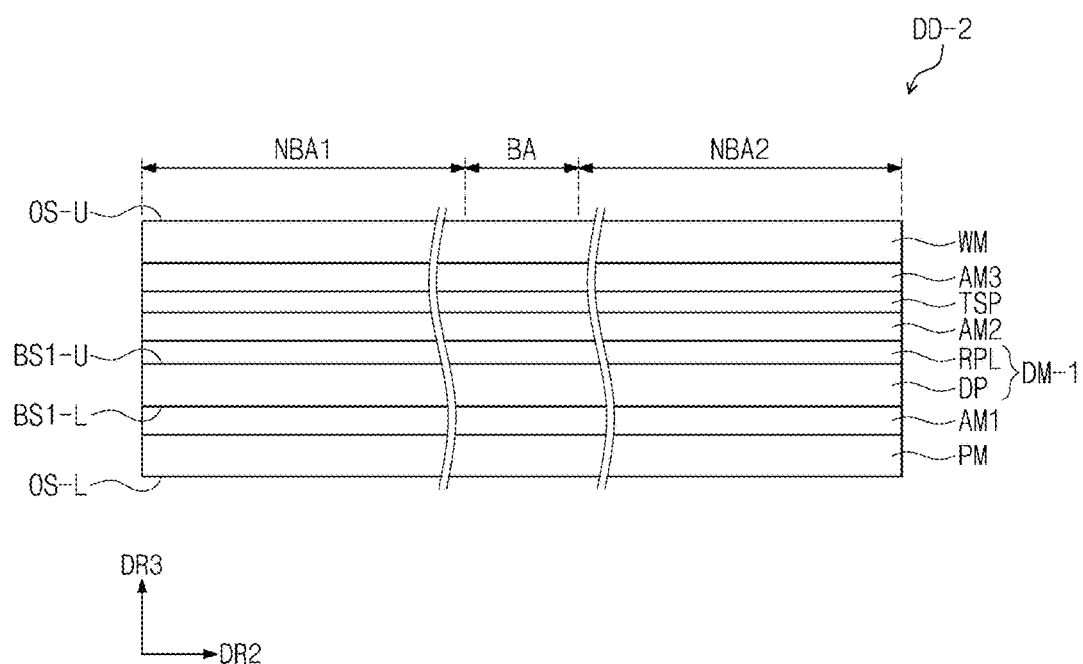
FIG. 10A is a cross-sectional view of a display apparatus according to an embodiment of the inventive concept.
Figure 10B:
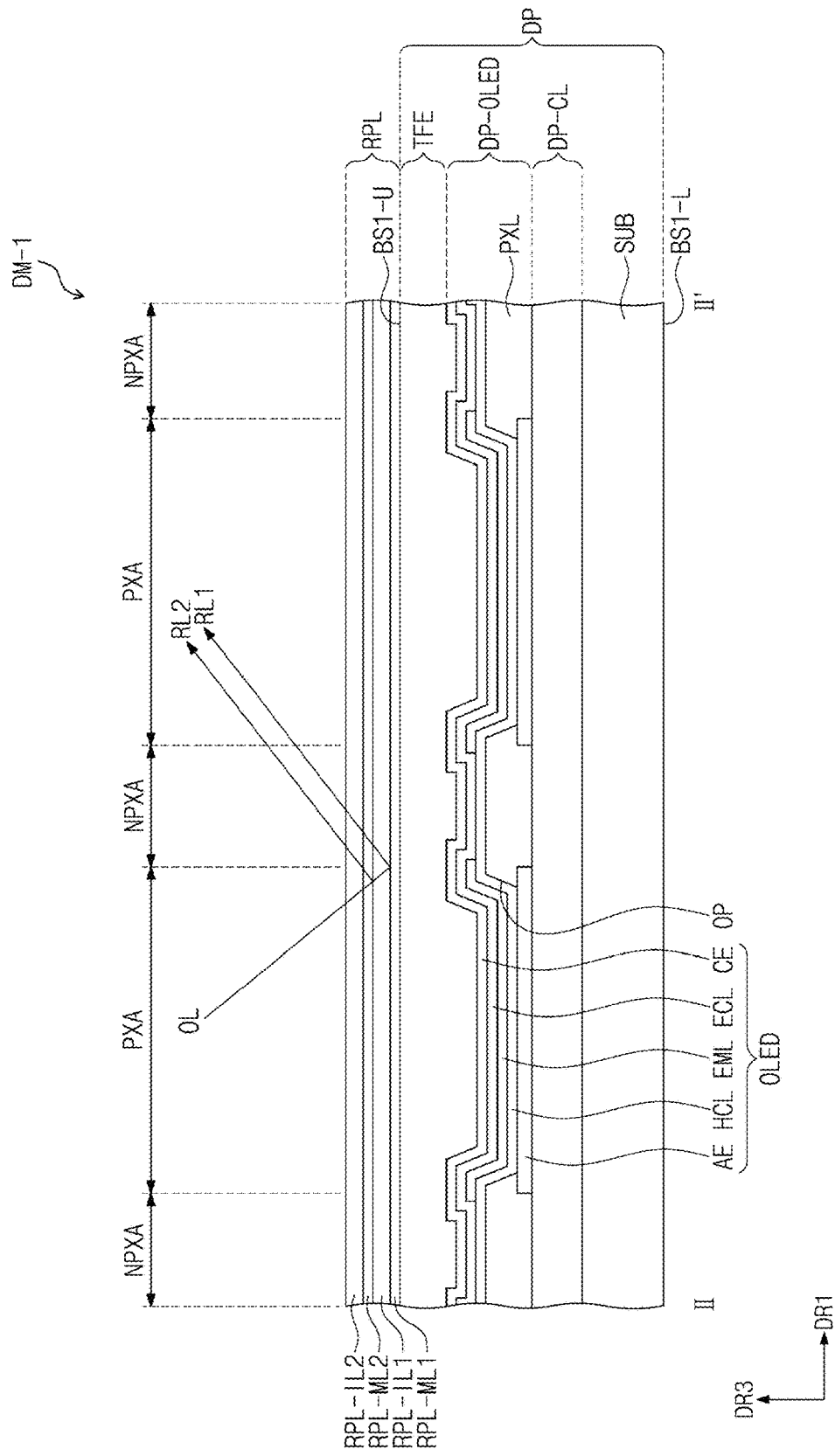
FIG. 10B is an enlarged cross-sectional view of the display apparatus according to an embodiment of the inventive concept.
Figure 11:
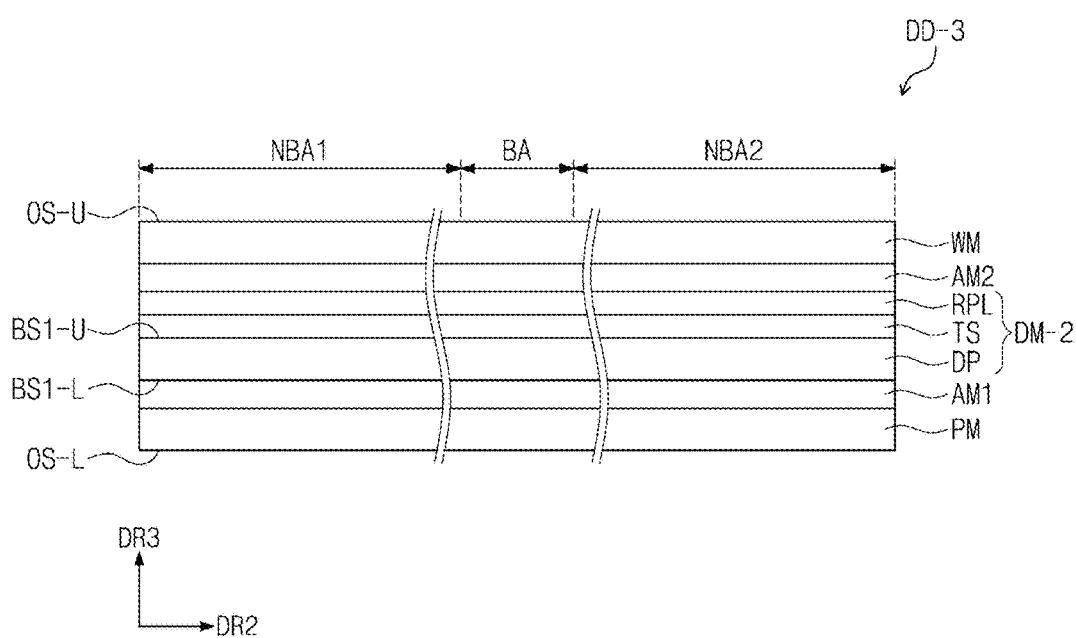
FIG. 11 is a cross-sectional view of a display device according to an embodiment of the inventive concept.

FIG. 10A is a cross-sectional view of a display apparatus DD-2 according to an embodiment of the inventive concept. FIG. 10B is an enlarged cross-sectional view of the display module DM-1 of the display apparatus DD-2 according to an embodiment of the inventive concept. FIG. 11 is a cross-sectional view of a display apparatus DD-3 according to an embodiment of the inventive concept. Hereinafter, detailed descriptions of the same constituent elements as those described with reference to FIGS. 1 to 9 will not be provided.

As illustrated in FIGS. 10A and 10B, the display apparatus DD-2 includes a protection film PM, a display module DM-1, a touch panel TSP, a window WM, a first adhesion member AM1, a second adhesion member AM2, and a third adhesion member AM3. The display module DM-1 may include an organic light emitting display panel DP and a reflection prevention layer RPL. The reflection prevention layer RPL may be directly disposed on the organic light emitting display panel DP.

The reflection prevention layer RPL may include conductive layers RPL-ML1 and RPL-ML2, which respectively overlap the display area DA and the non-display area NDA, and insulation layers RPL-IL1 and RPL-IL2, which respectively overlap the display area DA and the non-display area NDA. The reflection prevention layer RPL including two conductive layers RPL-ML1 and RPL-ML2 and two insulation layers RPL-IL1 and RPL-IL2 is illustrated as an example, but embodiments of the present disclosure are not limited thereto.

The conductive layers RPL-ML1 and RPL-ML2 and the insulation layers RPL-IL1 and RPL-IL2 may be alternately laminated. However, an embodiment of the inventive concept is not limited to this lamination order. The first conductive layer RPL-ML1 may include a metal having an absorption rate of about 30% or more. The first conductive layer RPL-ML1 may be formed of a material having a refractive index of about 1.5 to about 7 and an absorption coefficient k of about 1.5 to about 7. The first conductive layer RPL-ML1 may be formed of at least one selected from chrome (Cr), molybdenum (Mo), tungsten (W), titanium (Ti), nickel (Ni), cobalt (Co), copper oxide (CuO), titanium nitride (TiNx), and nickel sulfide (NiS). The first conductive layer RPL-ML1 may be a metal layer formed of one of the above-described materials. In some embodiments, the second conductive layer RPL-ML2 may also include the above-described metals.

Each of the first insulation layer RPL-IL1 and the second insulation layer RPL-IL2 may be formed of one selected from silicon dioxide ($SiO_2$), titanium dioxide ($TiO_2$), lithium fluoride (LiF), calcium fluoride ($CaF_2$), magnesium fluoride ($MaF_2$), silicon nitride ($SiN_x$), tantalum oxide ($Ta_2O_5$), niobium oxide ($Nb_2O_5$), silicon carbon nitride (SiCN), molybdenum oxide ($MoO_x$), iron oxide ($FeO_x$), and chromium oxide ($CrO_x$). Light OL incident from the outside is partially reflected by the first conductive layer RPL-ML1 (hereinafter, the light reflected by the first conductive layer RPL-ML1 is referred to as a first reflected light RL1) and the second conductive layer RPL-ML2 (hereinafter, the light reflected by the second conductive layer RPL-ML2 is referred to as a second reflected light RL2).

The first insulation layer RPL-IL1 may adjust a phase of light passing through the first insulation layer RPL-IL1, such that the first reflected light RL1 and the second reflected light RL2 have a phase difference of about 180° therebetween. Thus, the first reflected light RL1 and the second reflected light RL2 may be offset Thickness and material for each of the first conductive layer RPL-ML1, the second conductive layer RPL-ML2, the first insulation layer RPL-IL1, and the second insulation layer RPL-IL2 may be selected to satisfy (or be suitable for) conditions for instructive interference between the first reflected light RL1 and the second reflected light RL2. However, an embodiment of the inventive concept is not particularly limited thereto. In some embodiments, the reflection prevention layer RPL may further include a black matrix BM.

To prevent or reduce the possibility of bubbles being generated during the formation of the reflection prevention layer RPL, at least one of the first insulation layer RPL-IL1 and the second insulation layer RPL-IL2 may include an inorganic layer having a density of about 2.05 $g/cm^3$ to about 2.4 $g/cm^3$. For example, each of the first insulation layer RPL-IL1 and the second insulation layer RPL-IL2 may include a silicon nitride layer having the above-described density.

As illustrated in FIG. 11, the display apparatus DD-3 includes a protection film PM, a display module DM-2, a window WM, a first adhesion member AM1, and a second adhesion member AM2. The display module DM-2 may include an organic light emitting display panel DP, a touch sensing unit TS, and a reflection prevention layer RPL. The touch sensing unit TS may be directly disposed on the organic light emitting display panel DP, and the reflection prevention layer RPL may be directly disposed on the touch sensing unit TS.

The touch sensing unit TS may have the same structure as that described with reference to FIGS. 1 to 9, and the reflection prevention layer RPL may have the same structure as that described with reference to FIGS. 10A and 10B.

As described above, the inorganic layer having a density of about 2.05 $g/cm^3$ to about 2.4 $g/cm^3$ may seal the seed that may otherwise cause the generation of the bubbles. For example, the seed may be sealed adjacent to the thin film encapsulation layer.

The inorganic layer may prevent or reduce the seed from approaching the organic layer. Thus, the reaction between the seed and the organic layer may be prevented or reduced, and the generation of the bubbles may be suppressed or reduced. Therefore, the delamination between the organic adhesion member and the window may be reduced.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the example embodiments of the present inventive concept have been described herein, it will be apparent to those skilled in the art that various modifications and variations can be made in the inventive concept. Thus, it is intended that the present disclosure covers the modifications and variations of this invention provided they come within the scope of the appended claims and their equivalents.

What is claimed is:

1. A display apparatus comprising:
   an organic light emitting display panel comprising a base layer, a circuit layer on the base layer, a light emitting element layer on the circuit layer, and a thin film encapsulation layer on the light emitting element layer;
   a first conductive layer on the thin film encapsulation layer;
   a second conductive layer on the thin film encapsulation layer, the second conductive layer being on a layer other than the first conductive layer;
   at least one inorganic layer directly on the thin film encapsulation layer and having a density of about 2.05 g/cm$^3$ to about 2.4 g/cm$^3$;
   an organic layer on the at least one inorganic layer; and
   a window facing the organic light emitting display panel, with the first conductive layer, the at least one inorganic layer, and the organic layer between the window and the organic light emitting display panel.

2. The display apparatus of claim 1, wherein the at least one inorganic layer comprises a silicon nitride layer having a density of about 2.05 g/cm$^3$ to about 2.4 g/cm$^3$.

3. The display apparatus of claim 1, wherein the thin film encapsulation layer comprises:
   a plurality of inorganic thin films; and
   at least one organic thin film between the plurality of inorganic thin films.

4. The display apparatus of claim 3, wherein the at least one inorganic layer comprises:
   a first inorganic layer between the first conductive layer and the second conductive layer; and
   a second inorganic layer on the first conductive layer and the second conductive layer.

5. The display apparatus of claim 3, wherein the at least one inorganic layer is between the first conductive layer and the second conductive layer, and
   the organic layer is contacted with the second conductive layer.

6. The display apparatus of claim 5, further comprising an organic adhesion layer configured to couple the window to the organic light emitting display panel.

7. The display apparatus of claim 3, wherein the at least one inorganic layer is contacted with the second conductive layer, and
   wherein the display apparatus further comprises an intermediate insulation layer between the first conductive layer and the second conductive layer.

8. The display apparatus of claim 7, wherein the organic layer comprises an organic adhesion layer configured to couple the window to the organic light emitting display panel.

9. The display apparatus of claim 1, further comprising a polarizing film between the at least one inorganic layer and the window.

10. The display apparatus of claim 1, wherein the first conductive layer comprises bridge parts, and
    the second conductive layer comprises:
        connection parts respectively crossing the bridge parts,
        first touch sensor parts, the connection parts respectively connecting adjacent first touch sensor parts, and
        second touch sensor parts, the bridge parts respectively connecting adjacent second touch sensor parts.

11. The display apparatus of claim 10, wherein the light emitting element layer comprises an emission area and an non-emission area adjacent to the emission area,
    wherein each of the first touch sensor parts and the second touch sensor parts has a mesh pattern and overlaps the non-emission area.

12. The display apparatus of claim 1, wherein the first conductive layer comprises:
    connection parts,
    first touch sensor parts, the connection parts respectively connecting adjacent first touch sensor parts, and
    second touch sensor parts spaced apart from the first touch sensor parts, and
    the second conductive layer comprises bridge parts, the bridge parts respectively connecting adjacent second touch sensor parts and respectively crossing the connection parts.

13. The display apparatus of claim 1, wherein the first conductive layer comprises first connection parts and first touch sensor parts, the first connection parts respectively connecting adjacent first touch sensor parts, and
    the second conductive layer comprises second connection parts respectively crossing the first connection parts, and second touch sensor parts, the second connection parts respectively connecting adjacent second touch sensor parts.

14. The display apparatus of claim 1, wherein first light reflected by the first conductive layer and second light reflected by the second conductive layer have a phase difference of about 180° therebetween.

15. The display apparatus of claim 14, wherein the at least one inorganic layer comprises:
    a first inorganic layer between the first conductive layer and the second conductive layer, and a second inorganic layer on the first conductive layer and the second conductive layer.

16. The display apparatus of claim 1, wherein the window comprises a plastic film.

17. The display apparatus of claim 16, wherein the organic layer comprises an organic adhesion layer contacting the window.

18. A display apparatus comprising:
    an organic light emitting display panel comprising a base layer, a circuit layer on the base layer, a light emitting element layer on the circuit layer, and a thin film encapsulation layer on the light emitting element layer;
    a touch sensing unit directly on the thin film encapsulation layer;
    an organic adhesion layer on the touch sensing unit; and
    a window facing the organic light emitting display panel, with the touch sensing unit and the organic adhesion layer between the window and the organic light emitting display panel,
    wherein the touch sensing unit comprises:
    conductive patterns on the thin film encapsulation layer; and
    an insulation layer covering the conductive patterns,
    wherein the insulation layer comprises an inorganic layer having a density of about 2.05 g/cm$^3$ to about 2.4 g/cm$^3$.

19. A display apparatus comprising:
    a display panel comprising a first inorganic layer;
    first conductive patterns directly on the first inorganic layer;
    a first insulation layer covering the first conductive patterns;

second conductive patterns directly on the first insulation layer;

second insulation layer covering the second conductive patterns;

an organic adhesion layer on the second insulation layer; and a window facing the display panel with the organic adhesion layer between the window and the display panel, wherein at least one of the first insulation layer and the second insulation layer comprises an inorganic layer having a density of about 2.05 g/cm$^3$ to about 2.4 g/cm$^3$.

20. The display apparatus of claim 19, wherein the inorganic layer of the at least one of the first insulation layer and the second insulation layer comprises a silicon nitride layer.

* * * * *